(12) United States Patent
Vinciarelli et al.

(10) Patent No.: US 7,952,879 B1
(45) Date of Patent: May 31, 2011

(54) SYSTEM AND APPARATUS FOR EFFICIENT HEAT REMOVAL FROM HEAT-GENERATING ELECTRONIC MODULES

(75) Inventors: Patrizio Vinciarelli, Boston, MA (US); Michael B. Lafleur, East Hampstead, NH (US)

(73) Assignee: VLT, Inc., Sunnyvale, CA (US)

( * ) Notice: Subject to any disclaimer, the term of this patent is extended or adjusted under 35 U.S.C. 154(b) by 227 days.

(21) Appl. No.: 12/423,417

(22) Filed: Apr. 14, 2009

Related U.S. Application Data

(60) Provisional application No. 61/045,110, filed on Apr. 15, 2008.

(51) Int. Cl.
  *H05K 7/20* (2006.01)
  *F28F 7/00* (2006.01)

(52) U.S. Cl. ....... 361/704; 165/80.2; 165/185; 361/707; 361/708; 361/715; 361/719

(58) Field of Classification Search .................... 361/708
See application file for complete search history.

(56) References Cited

U.S. PATENT DOCUMENTS

| | | | | | |
|---|---|---|---|---|---|
| 3,699,394 | A | * | 10/1972 | Schuler | 361/714 |
| 5,258,888 | A | * | 11/1993 | Korinsky | 361/704 |
| 5,365,403 | A | * | 11/1994 | Vinciarelli et al. | 361/707 |
| 5,728,600 | A | | 3/1998 | Saxelby, Jr. et al. | |
| 5,835,350 | A | * | 11/1998 | Stevens | 361/704 |
| 5,887,435 | A | * | 3/1999 | Morton | 62/3.6 |
| 5,920,119 | A | * | 7/1999 | Tamba et al. | 257/718 |
| 6,005,773 | A | * | 12/1999 | Rozman et al. | 361/707 |
| 6,356,448 | B1 | * | 3/2002 | DiBene et al. | 361/721 |
| 6,403,009 | B1 | | 6/2002 | Saxelby, Jr. et al. | |
| 6,434,005 | B1 | | 8/2002 | Vinciarelli et al. | |
| 6,623,281 | B2 | | 9/2003 | Vinciarelli et al. | |
| 6,930,893 | B2 | | 8/2005 | Vinciarelli et al. | |
| 7,149,088 | B2 | * | 12/2006 | Lin et al. | 361/704 |
| 7,173,824 | B2 | * | 2/2007 | Laurent et al. | 361/707 |
| 7,206,204 | B2 | * | 4/2007 | Nakatsu et al. | 361/703 |
| 7,236,368 | B2 | * | 6/2007 | Maxwell et al. | 361/719 |
| 7,361,844 | B2 | | 4/2008 | Vinciarelli et al. | |
| 7,375,974 | B2 | * | 5/2008 | Kirigaya | 361/752 |

* cited by examiner

*Primary Examiner* — Gregory D Thompson
(74) *Attorney, Agent, or Firm* — Fish & Richardson P.C.

(57) ABSTRACT

This document describes apparatus and methods for a self-contained assembly having an encapsulated electronic module coupled to a heat removal device by a thermally conductive substance. In an illustrative example, the module includes at least one heat dissipating device thermally coupled by internal members to selected portions of a housing. The module housing includes a flat top surface with a perimeter adjoined to side surfaces. In one example, the heat removal device includes a cavity interior surface with an upper surface to match the module top surface, and side walls that match at least 50% by area of the selected portions of the module side surfaces. The cavity interior surface may receive at least 50% of the housing surface area. The matched portion of the cavity side surfaces may be at least 33% by area of the portion of the cavity upper surface that matches the module top surface.

33 Claims, 24 Drawing Sheets

SYSTEM AND APPARATUS FOR EFFICIENT HEAT REMOVAL FROM HEAT-GENERATING ELECTRONIC MODULES

CROSS REFERENCE TO RELATED APPLICATIONS

This application claims priority to application Ser. No. 61/045,110, filed by Vinciarelli on Apr. 15, 2008 and entitled "System and Apparatus for Efficient Heat Removal from Heat-Generating Electronic Modules," the entire disclosure of which is incorporated herein by reference.

BACKGROUND

Electronic switching power converters accept electric power from a source and convert it into a form suitable for use by a load. As used herein, a power converter refers to devices that convert electric power received from a source (AC or DC) for delivery to a load, providing some of the following functions: voltage transformation (step-up or step-down), regulation (current, voltage, or power), and galvanic isolation. Examples of switching power converters include DC-DC converters, switching regulators, and DC Transformers such as Voltage Transformation Modules.

As used herein, the power density of a power converter refers to the full rated output power of the power converter divided by the volume occupied by the converter. Trends in contemporary power conversion have resulted in dramatic increases in power density of marketable power converters. Prior to 1984, power densities were typically below 10 Watts-per-cubic-inch. In contrast, power densities greater than 500 Watts-per-cubic-inch have become possible today. A very high density, galvanically isolated, point of load DC-to-DC transformer, called a Sine Amplitude Converter "VTM" is described in Vinciarelli, Factorized Power Architecture With Point of Load Sine Amplitude Converters, U.S. Pat. No. 6,930,893, issued Aug. 16, 2005 (the "SAC Patent").

As used herein, the current density of a power converter refers to the full rated output current of the converter divided by the board area occupied by the converter. Current density specifications are trending up in some microprocessor (referred to herein as "CPU's") applications. For example, some microprocessors are approaching current specifications up to about 100 Amperes or more. Moreover, the dynamic load requirements call for the power converter that supplies such currents to be in close proximity to the CPU. Commercially available solutions are characterized by a current density of less than 10 Amps-per-square inch. Sine Amplitude Converter VTMs, such as those described in the SAC Patent, are capable of providing the low voltage requirements of future microprocessors with current densities exceeding 50 Amps-per-square inch. They utilize a multi-layer circuit board assembly including transformer core structures protruding from both sides of the circuit board. Output currents in excess of 50 Amperes need to be carried from the converter's PCB, at one elevation, and then to the CPU board at a different elevation. The interconnections associated with these elevation changes call for low resistance and low inductance consistent with the current slew rate requirements of a highly dynamic load.

In general, power converters dissipate heat in operation. Increases in power density can complicate thermal management, particularly where the increase in power density exceeds the corresponding increase in efficiency, the net effect of which is a net increase in heat density. Thus, advancements in power conversion technology may often present significant challenges in terms of thermal management technology. These challenges impose constraints on the packaging architecture used to house the converter and its input and output terminals. For example, the power converter package must exhibit low thermal resistance between its internal hot spots, particularly its semiconductor junctions, and external heat sinks. Depending on the specific thermal environment surrounding the power converter, it is desirable to remove heat from the converter package through its case and/or terminals. Low junction-to-case and junction-to-terminal thermal resistances help to keep internal temperature rises acceptable. However, a good thermal interface should not interfere with the need for flexible mounting of the power converter package. Furthermore, a solution should provide for mechanical tolerances of the converter package and of the system with which the converter is coupled.

With available space for components on printed circuit boards at a premium, a power supply on the board can complicate signal routing to a high-pin count component, such as a CPU. In some bulk power solutions, the bulk power supplies are located at a distance from the load to avoid dissipating additional heat near the processor. This allows for a greater ease in keeping components on the board together without occupying significant space around the CPU or generating heat concerns in close proximity to the load components.

A power conversion apparatus, in which a power converter is mounted in an aperture in a circuit board, and in which a compliant connection scheme along the sides of the power converter allows for variation of the extension of the power converter within the aperture, is described in Vinciarelli et al, Mounting Electronic Components on Circuit Boards, U.S. Pat. No. 6,623,281, issued Sep. 23, 2003 (assigned to the same assignee as this application and incorporated by reference). A power conversion apparatus, in which a power converter is mounted in an aperture in a circuit board, and in which at least four sides of the power converter, including the two sides which lie entirely above and below the surfaces of the circuit board, are covered with heat sinks to aid in the removal of heat from the power converter, is described in Vinciarelli et al, Power Converter Packaging, U.S. Pat. No. 6,434,005, issued on Aug. 13, 2002 (assigned to the same assignee as this application and incorporated by reference).

Techniques for over molding electronic components on one side of a substrate are known. In one example, electronic devices mounted on one side of a printed circuit board assembly are over-molded with encapsulant and the other side of the printed circuit board assembly, which is not over-molded, comprises a ball grid or a land grid array of electrical contacts. The package architecture sometimes referred to as "System In a Package" (SIP) provides some of the electrical, mechanical and thermal management characteristics required of high power density and high current density converters. However, the SIP architecture is incompatible with two-sided circuit board assembly including transformer core structures protruding from both sides of the circuit board. Furthermore, the SIP package provides limited mechanical and thermal management flexibility.

Intel Corporation, Santa Clara, Calif., USA, manufactures microprocessors which are packaged in a package, called a Micro-FCPGA package, which comprises a component over molded on one side of a substrate and a pin-grid-array and exposed capacitors on the other side of a substrate.

Saxelby, Jr., et al, Circuit Encapsulation Process, U.S. Pat. No. 5,728,600, issued Mar. 17, 1998, and Saxelby, Jr., et al, Circuit Encapsulation, U.S. Pat. No. 6,403,009, issued Jun. 11, 2002 (both assigned to the same assignee as this application and both are incorporated herein in their entirety by reference) describe ways of over-molding both sides of a printed circuit board assembly while leaving opposing regions on both sides of the printed circuit board free of encapsulant. This is useful for exposing a row of contacts that extend along an edge of the printed circuit board on both sides of the board.

SUMMARY

This document describes apparatus and methods for a self-contained assembly having an encapsulated electronic module coupled to a heat removal device by a thermally conductive substance. In an illustrative example, the module includes at least one heat dissipating device thermally coupled by internal members to selected portions of a housing. The module housing includes a flat top surface with a perimeter adjoined to side surfaces. In one example, the heat removal device includes a cavity interior surface with an upper surface to match the module top surface, and side walls that match at least 50% by area of the selected portions of the module side surfaces. The cavity interior surface may receive at least 50% of the housing surface area. The matched portion of the cavity side surfaces may be at least 33% by area of the portion of the cavity upper surface that matches the module top surface.

In various examples, the electronic module may include an internal heat conducting structure or module terminals. A thermally conductive substance may couple the first cavity upper surface and side walls to the first module top and perimeter surfaces matched portions.

In general, in one aspect, an apparatus includes a first encapsulated electronic module configured as a self-contained assembly, a heat removal device including a first cavity having an interior surface, and a thermally conductive substance in the first cavity. The first encapsulated electronic module has a first generally box-like exterior shape including a generally flat top surface and a perimeter surface including side surfaces adjoining the top surface, each side surface having a length along a perimeter of the exterior shape and a height normal (generally perpendicular) to a plane parallel to the top surface. Electronic circuitry is provided within the first exterior shape, the electronic circuitry including a plurality of heat dissipating devices. A heat conducting structure internal to the first module is adapted to conduct heat from the heat dissipating devices to a selected area of the perimeter surface. A plurality of module terminals make electrical connections to the electronic circuitry of the first module. The interior surface of the heat removal device has an upper surface adapted to match a portion of the top surface, and side walls adapted to match a portion of the perimeter surface, the matched portion of the perimeter surface including at least fifty percent (50%) of the selected area of the perimeter surface. The interior surface is adapted to receive at least fifty percent (50%) of the first exterior shape, and the matched portion of the perimeter surface is at least thirty three percent (33%) of the matched portion of the top surface by area. The thermally conductive substance in the first cavity is adapted to thermally couple the upper surface and side walls of the first cavity to the matched portions of the top and perimeter surfaces of the first module.

Implementations may include one or more of the follow features. The heat conducting structure may include a multi-layer substrate having at least 4 metallization layers each at least 2.2 mils thick and at least 3 insulation layers. The multilayer substrate may include an internal printed circuit board ("PCB") having a plurality of conductive traces adapted to connect to the heat dissipating devices and to respective ones of the plurality of module terminals, the plurality of conductive traces being formed in a plurality of the metallization layers. In some examples, the internal PCB may include at least 6 conductive layers. In some examples, the internal PCB may include at least 14 conductive layers. The plurality of module terminals may be arranged along a bottom surface of the first module. The plurality of module terminals may be arranged along one or more overhang surfaces generally parallel to the top surface and adjacent to the perimeter surface of the first module. The apparatus may include an external PCB external to the first module, the external PCB including conductive traces having a module contact region for connecting to respective ones of the module terminals and a system contact region for connecting to respective ones of a plurality of system terminals, the system terminals providing for electrical connection between the first module and circuitry external to the apparatus. The external PCB may lie adjacent to a bottom surface of the first module. The bottom surface of the first module may be generally rectangular and the external PCB may lie adjacent and generally parallel to the bottom surface of the first module. The interior surface of the first cavity may be adapted to receive substantially all of the top surface. The interior surface of the first cavity may be adapted to receive substantially all of the perimeter surface.

The heat removal device may include a second cavity, and further includes a second encapsulated electronic module configured as a self-contained assembly. The second encapsulated electronic module may have a second generally box-like exterior shape including a generally flat top surface and a perimeter surface including side surfaces adjoining the top surface, each side surface having a length along a perimeter of the exterior shape and a height normal (generally perpendicular) to a plane parallel to the flat top surface. Electronic circuitry may be provided within the second exterior shape, the electronic circuitry including a plurality of heat dissipating devices. A heat conducting structure internal to the second module may be adapted to conduct heat from the heat dissipating devices to a selected area of the perimeter surface of the second module. A plurality of module terminals may be provided for making electrical connections to the electronic circuitry of the second module.

The second cavity may include an interior surface adapted to receive at least fifty percent of the second exterior shape. The interior surface of the second cavity may have an upper surface adapted to match a portion of the top surface of the second exterior shape; and side walls adapted to match a portion of the perimeter surface of the second exterior shape, the matched portion of the perimeter surface of the second module including at least fifty percent (50%) of the selected area of the perimeter surface of the second module. The matched portion of the perimeter surface of the second module may be at least thirty three percent (33%) of the matched portion of the top surface of the second module by area. The second cavity includes a thermally conductive substance adapted to thermally couple the upper surface and side walls of the second cavity to the matched portions of the top and perimeter surfaces of the second module. An external printed circuit board ("PCB") external to the first and second modules may be provided, the external PCB including conductive traces having first and second module contact regions for connecting to respective ones of the plurality of module terminals of the first and second modules and a system contact region for connecting to respective ones of a plurality of system terminals, the system terminals providing for electrical connection between the first and second modules and circuitry external to the apparatus. For each of the first and second modules, the matched portion of the perimeter surface of the respective module may be at least fifty percent (50%) of the matched portion of the top surface of the respective module by area. For each of the first and second modules, the matched portion of the perimeter surface of the respective module may include at least fifty percent (50%) of the entire perimeter surface of the respective module by area.

The plurality of module terminals may be arranged along a bottom surface of the first and second modules. The plurality of module terminals of the first and second modules may be arranged along a respective one or more overhang surfaces generally parallel to the top surface and adjacent to the perimeter surface of the respective module. The first module may include a first power converter and the second module may include a second power converter. The first and second modules may be connected together to form a power sharing array. The first module may include a first power converter, the second module may include a second power converter, and the first and second modules may be connected in cascade with an output of the first power converter connected to an input of the second power converter. The first module may include an encapsulating material forming at least some of the top and perimeter surfaces of the exterior shape of the first module. The first and second modules may include an encapsulating material forming at least some of their respective top and perimeter surfaces of their respective exterior shapes.

A bezel may be provided, in which the bezel has an internal flange adapted to extend into and proximate the side walls of the first cavity, an internal shoulder adapted to rest against the heat removal device at places along a perimeter of the first cavity, an outer flange adapted to surround at least a portion of a perimeter edge of an external PCB, and an outer shoulder adapted to rest against a surface of the external PCB. The bezel may be adapted to provide electrical insulation between the terminals and the side walls of the first cavity, and provide a controlled minimum space between the perimeter surface of the first module and the side walls of the first cavity. The thermally conductive substance may include a controlled volume of encapsulating material, the controlled volume being set to ensure filling of the first cavity to a predetermined minimum level with the first module assembled in the first cavity, the thermally conductive substance may be cured to a solid state, and the thermally conductive substance may include a minimum level of adhesion between the interior surface of the first cavity and the exterior surface of the first module providing mechanical integrity of the apparatus.

A bezel may be provided, in which the bezel has a first internal flange adapted to extend into and proximate the side walls of the first cavity, a first internal shoulder adapted to rest against a first portion of the heat removal device associated with the first module at places along a perimeter of the first cavity, a second internal flange adapted to extend into and proximate the side walls of the second cavity, a second internal shoulder adapted to rest against a second portion of the heat removal device associated with the second module at places along a perimeter of the second cavity, an outer flange adapted to surround at least a portion of a perimeter edge of the external PCB, and an outer shoulder adapted to rest against a surface of the external PCB. The bezel may be adapted to provide electrical insulation between the terminals of the first and second modules and the side walls of the first and second cavities, and provide a controlled minimum space between the perimeter surfaces of the first and second modules and the side walls of the first and second cavities, respectively. The thermally conductive substance may include a respective controlled volume of encapsulating material in each of the first and second cavities, the respective controlled volume being set to ensure filling of the first and second cavities to a respective predetermined minimum level with the respective modules assembled in the respective cavities, the thermally conductive substance may be cured to a solid state, and the thermally conductive substance may include a minimum level of adhesion between the interior surfaces of the respective cavities and the respective exterior surfaces of the respective modules providing mechanical integrity to the apparatus.

In general, in another aspect, a method of making an electronic power component includes providing heat dissipating electronic circuitry in a first module configured as a stand alone assembly and having module terminals for making electrical connections to the electronic circuitry; providing the first module with a generally box-like exterior shape including a generally flat top surface and a perimeter surface including side surfaces adjoining the top surface; providing a heat conducting structure internal to the first module adapted to conduct heat from the heat dissipating devices to a selected area of the perimeter surface; providing a heat removal device for the first module; providing a first cavity in the heat removal device, the first cavity including an interior surface having an upper surface and side walls; adapting the upper surface to match a portion of the top surface of the module; adapting the side walls to match a portion of the perimeter surface including at least fifty percent (50%) of the selected area; adapting the interior surface to receive at least fifty percent (50%) of the exterior shape of the first module; configuring the interior surface such that the matched portion of the perimeter surface is at least thirty three percent (33%) of the matched portion of the top surface by area; and providing a thermally conductive substance in the first cavity adapted to thermally couple the upper surface and side walls of the first cavity to the matched portions of the top and perimeter surfaces of the first module.

Implementations may include one or more of the following features. The method may include providing an external printed circuit board ("PCB") external to the first module; connecting contact regions on the external PCB to respective module terminals of the first module; and providing system terminals for establishing electrical connection between the first module and circuitry external to the apparatus. The method may include providing additional heat dissipating electronic circuitry in a second module configured as a stand alone assembly, the second module having a generally box-like exterior shape including a generally flat top surface and a perimeter surface including side surfaces adjoining the top surface; providing a second cavity in the heat removal device including an interior surface adapted to receive at least a portion of the second exterior shape including at least a portion of the top surface, the portion including a second top surface area, and at least a portion of the perimeter surface, the portion including a second perimeter surface area; providing a thermally conductive substance between the portions of the second top and first perimeter surface areas of the second module and the interior surface of the second cavity; and configuring the second perimeter surface area to be at least 33% of the second top surface area.

The method may include providing an external printed circuit board ("PCB") external to the first and second modules, the external PCB including conductive traces having first and second module contact regions for connecting to respective first and second module terminals and a system contact region for connecting to respective system terminals, the system terminals providing for electrical connection between the first and second modules and circuitry external to the apparatus. The method may include forming a power converter wherein the first module includes a first power converter and the second module includes a second power converter and further including connecting the modules together to form a power sharing array. The method may include forming a power converter wherein the first module includes a first power converter, the second module includes a second power converter, and further including connecting an output of the first power converter to an input of the second power converter.

In general, in another aspect, an apparatus includes an encapsulated electronic module having a top surface and a side surface that is at an angle to the top surface, the module including a heat dissipating device and a heat conducting structure both internal to the module, the heat conducting structure to conduct heat from the heat dissipating device to a portion of the side surface; a heat removal device having a structure defining a cavity adapted to receive a portion of the encapsulated electronic module, the structure having an interior surface facing the cavity, the interior surface including an upper inner surface and a side wall that match a portion of the top surface and a portion of the side surface, respectively, of the encapsulated electronic module; and a thermally conductive substance in the cavity to thermally couple the upper inner surface and side wall of the heat removal device to the matched portions of the top and side surfaces, respectively, of the encapsulated electronic module.

Some embodiments may provide one or more advantages. For example. some implementations may enhance achievable current and/or power density for supplying a regulated supply voltage to a load. In some examples, efficient thermal management may be provided through thermal coupling from power dissipating components in the electronic module to a heat removal device. Low thermal resistance may be achieved, for example, by specified minimum overlap and shape-matching between the interior surface of the heat removal device and selected portions of the electronic module, which may promote a combination of vertical and lateral heat transfer. Improved thermal management of the power converter may, for example, permit the power converter to supply a regulated supply voltage from a location in close proximity to a high current dynamic load (e.g., up to 120 Amps or more), which may include one or more microprocessors. Such close proximity may yield improved transient response under dynamic load conditions. In some implementations, a local power converter may minimize the number of obstacles to signal routing traces to a high pin count component by providing a low pin count electronic module that performs the power conversion processing. Some illustrative methods may readily be used to manufacture power converter assemblies by providing a thermally conductive compound to fill the small gap between surfaces of a module exterior and a heat removal device cavity interior, where the thermally conductive compound may act as an adhesive agent. In some examples, the gaps may be small and substantially uniform in size to promote heat transfer from the module to the heat removal device.

The details of one or more embodiments are set forth in the accompanying drawings and the description below. Other features, objects, and advantages will be apparent from the description and drawings, and from the claims.

DESCRIPTION OF DRAWINGS

We first briefly describe the drawings.

Like reference symbols in the various drawings indicate like elements.

DETAILED DESCRIPTION

Figure 1:
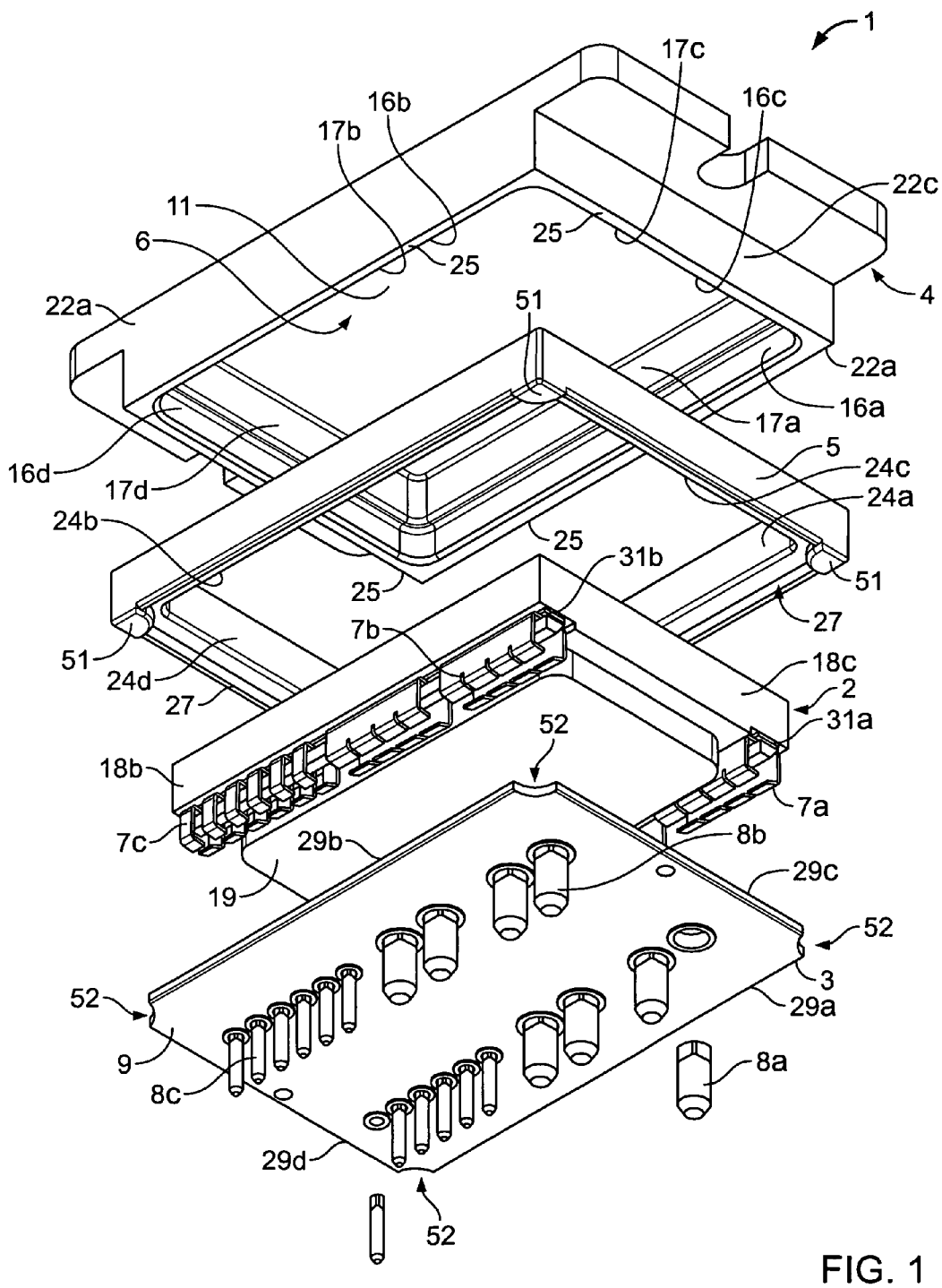
FIGS. 1 and 2 show exploded, perspective, views of an exemplary electronic assembly that includes an electronic module and a heat removal device.
Figure 2:
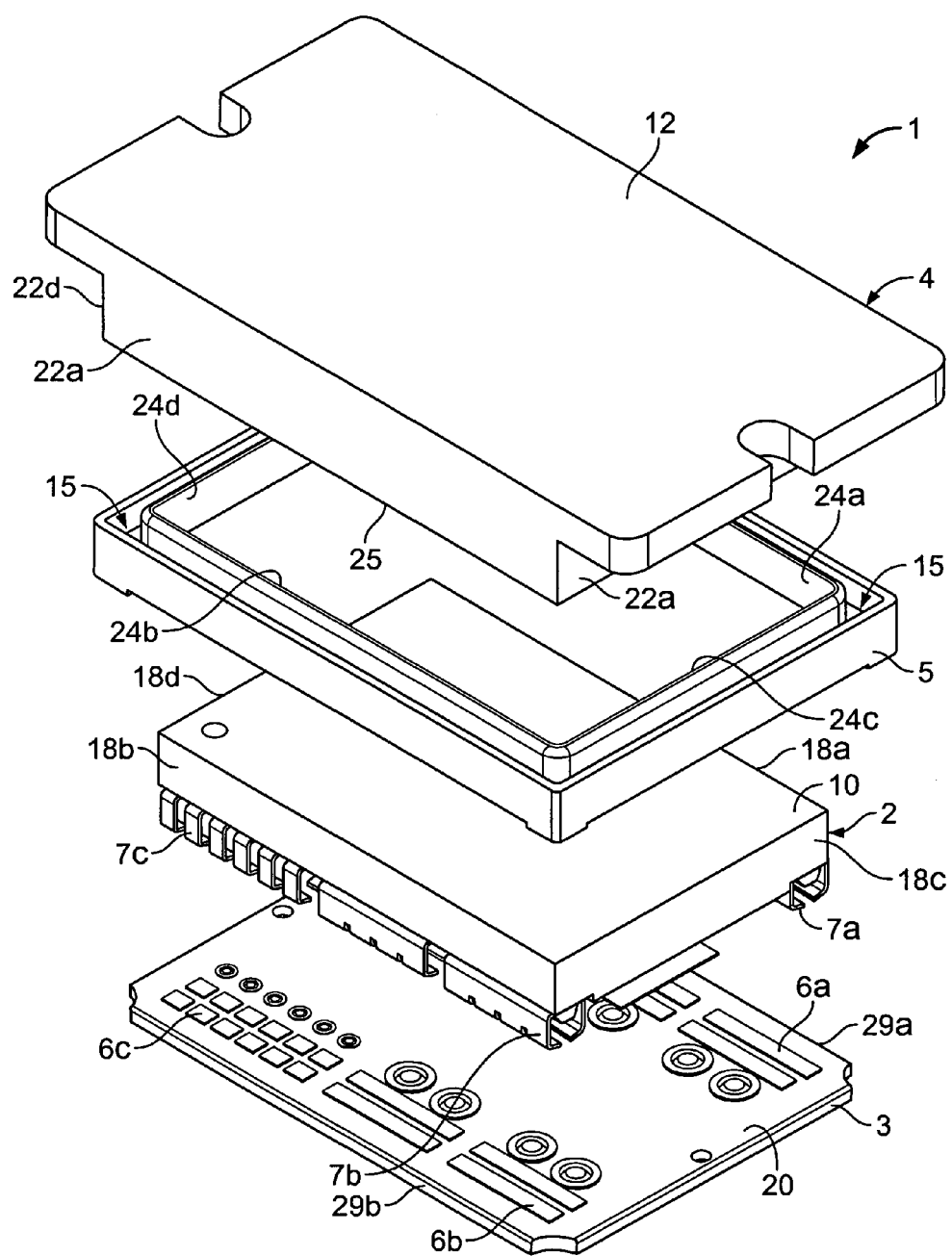
Figure 3:
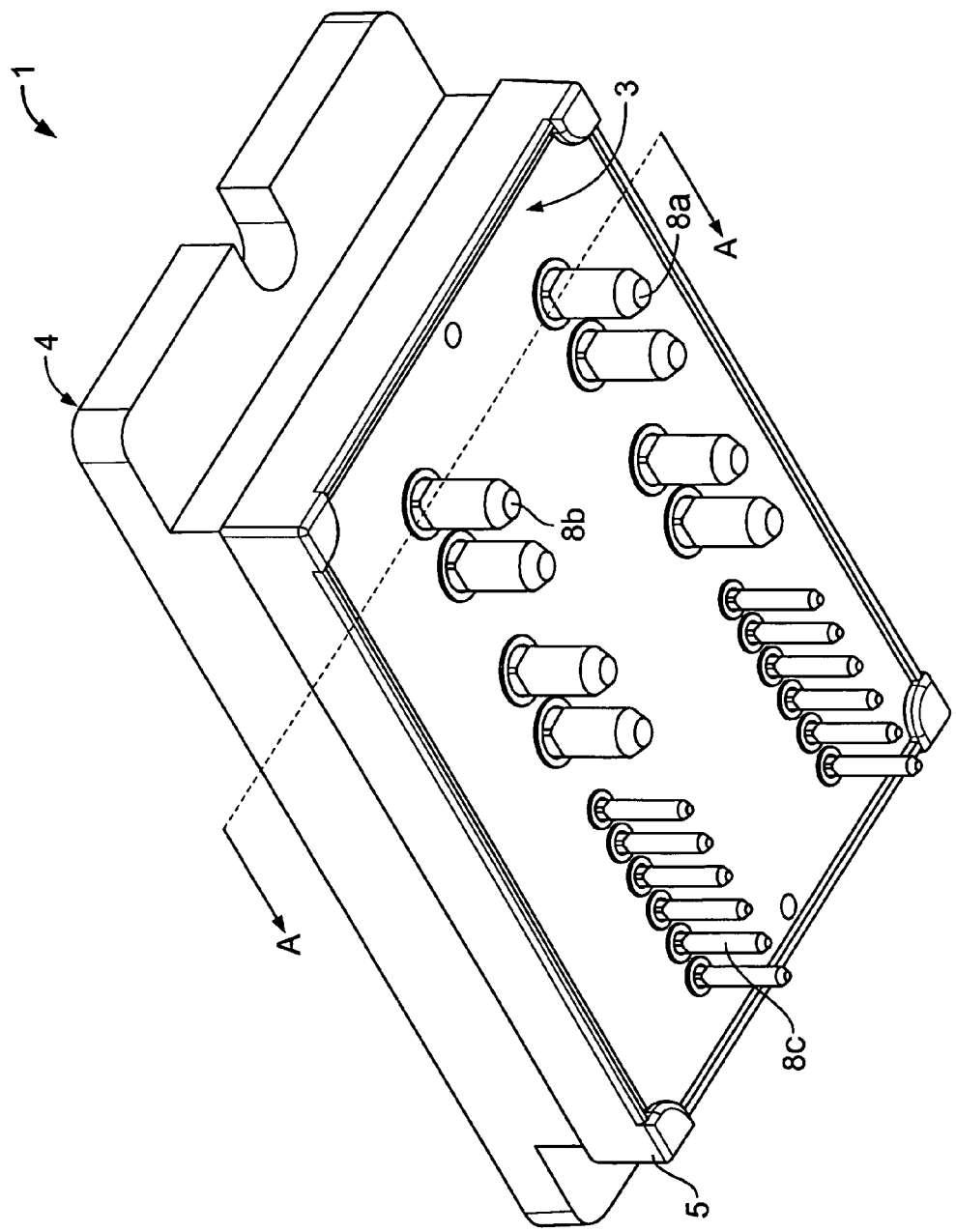
FIG. 3 shows a perspective view of the apparatus of FIGS. 1 and 2.
Figure 4:
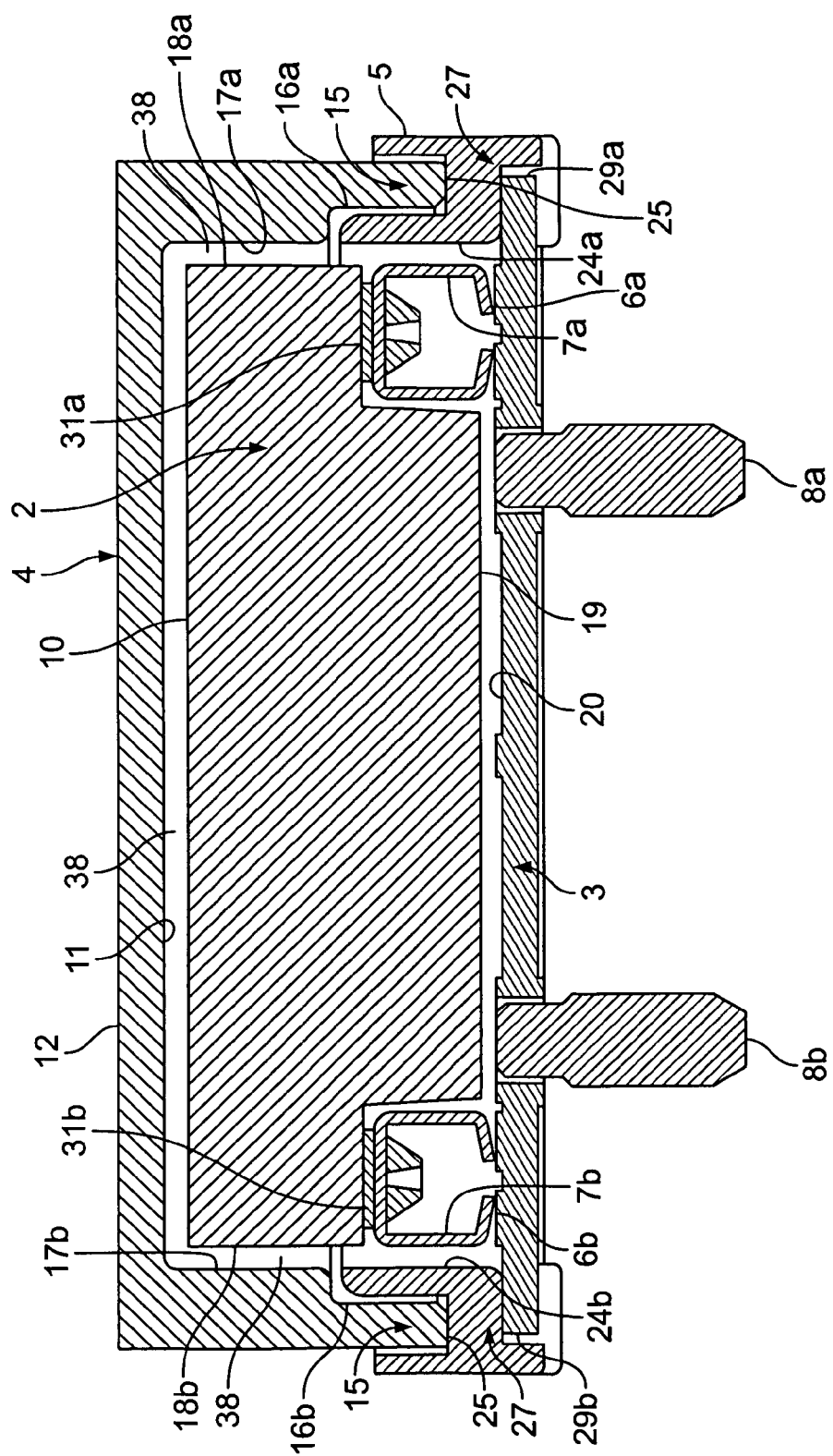
FIG. 4 shows a cross-sectional view of the apparatus of FIG. 3.

FIGS. 1 and 2 show exploded, perspective, views of an exemplary electronic assembly 1 (e.g. a power converter assembly), that includes an exemplary arrangement of an electronic module 2 and a heat removal device 4. FIG. 3 shows a perspective view of the fully assembled power converter 1. FIG. 4 shows an cross-sectional view (taken along line A-A in FIG. 3). FIGS. 5-8 show exploded, perspective views to illustrate the interrelationships of the components of the apparatus of FIG. 3.

The exemplary power converter assembly 1 includes an electronic module 2 and a heat removal device 4. When assembled and in operation, the electronic module 2 may generate substantial heat. To keep the module 2 within a safe temperature range for operation, the heat removal device 4 is substantially conformally arranged to fit around portions of the module 2. Small spaces, or gaps, between portions of the outer surface of the module 2 and interior cavity surfaces of the heat removal device 4 may be filled with a thermally conductive compound (not shown) to facilitate thermal communication from the module 2 to the heat removal device 4.

The power converter assembly 1 further includes a printed circuit board ("PCB") 3 and a skirt 5. As shown, the electronic module 2 includes terminals 7a, 7b, 7c that may be used to provide operational electrical connections (e.g., for carrying power and control signals) to operate circuitry internal to the module 2. The depicted module terminals 7a-7c are arranged in rows along terminal surfaces at overhang surfaces 31a, 31b along the length of the module 2. As shown in the cross section of FIG. 4, the module terminals 7a-7c may be connected (e.g., by means of solder) to conductive pads on PCB 3 (conductive pads 6a, 6b, 6c shown in FIGS. 2, 4). In some embodiments, the conductive pads may connect, by means of conductive traces (not shown) on PCB 3, to pins 8a, 8b, 8c mounted to the bottom side 9 of the PCB 3.

The converter module 2 has an exterior shape that includes a generally flat top surface 10 and a perimeter surface including four side surfaces 18a-18d. The side surfaces 18a-18d and the flat top surface 10 form a generally box-like shape. Each perimeter side surface 18a-18d is generally parallel to its respective opposite perimeter side surface (e.g., side 18a is generally parallel to side 18b) and square with its respective adjacent perimeter side surfaces (e.g., 18a is generally square with sides 18c, 18d). When assembled, the power converter assembly 1 may efficiently transfer heat from the module 2 to the heat removal device 4 via the top surface 10 and portions of the side surfaces 18a-18d.

Figure 5:
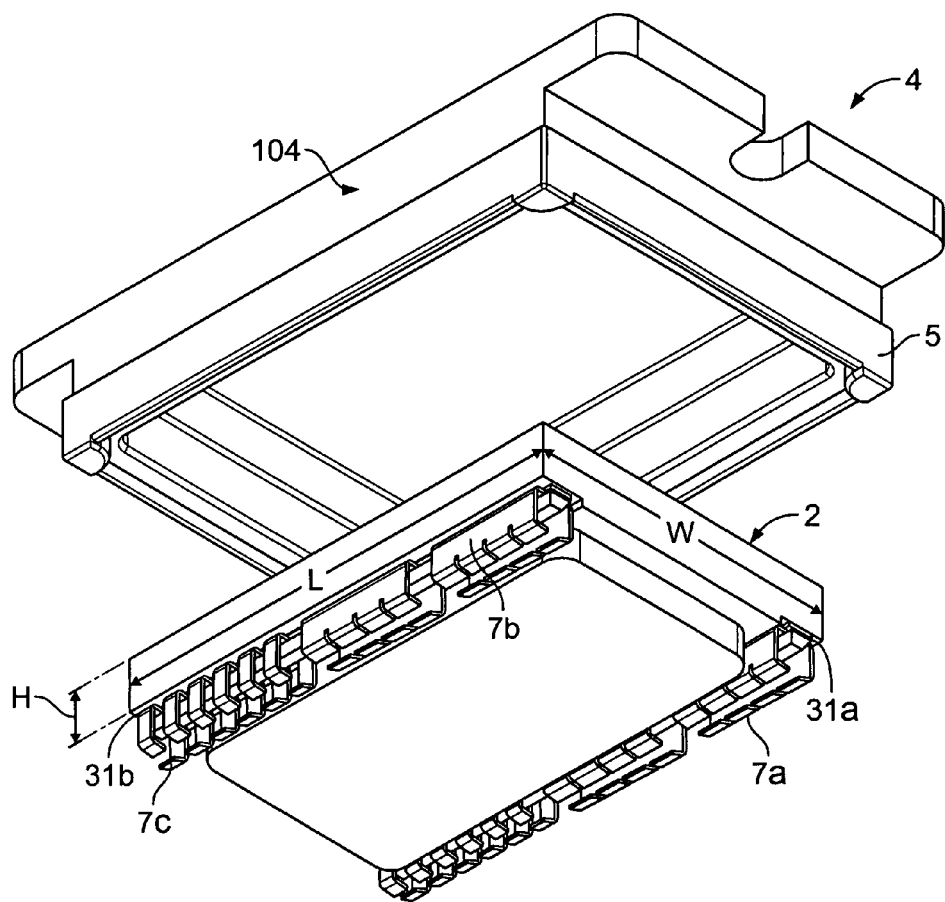
FIGS. 5 through 8 show exploded, perspective views of the apparatus of FIG. 3.

As depicted in FIGS. 1, 4, and 5, the terminal surfaces 31a, 31b of the module 2 are located on two overhang surfaces 31a, 31b, which are located in a plane that lies between the bottom surface 19 and the top surface 10. As used herein, an overhang surface of the module 2 may generally refer to a bottom-facing surface located in a plane that lies between the top surface 10 and the bottom surface 19. The bottom surface 19 of the module 2 may be seen in FIGS. 1 and 4.

In the example depicted in FIGS. 1, 2 and 4, the heat removal device 4 includes outer top surface 12, peripheral outer side surfaces 22a-22d, and a cavity 6 defined by an interior top surface 11. The heat removal device 4 may be made of one or more thermally conductive materials (e.g., aluminum). The interior surface of the cavity comprises the interior top surface 11 and interior side surfaces.

In the examples depicted in FIGS. 1 and 4, one or more of the interior side surfaces of the cavity 6 may include a step. Each stepped interior side surface may include a lower interior side surface (e.g., lower interior side surfaces 16a-16d) and an upper interior side surface (e.g., upper interior side surfaces 17a-17d). Opposite pairs of lower interior side surfaces (e.g., surface pairs 16a, 16b oppose each other) may be spaced apart further than opposite pairs of upper interior side surfaces (e.g., surface pairs 17a, 17b and 17c, 17d).

The skirt 5 may be formed of an electrically insulating material, which in some embodiments, may be a molded plastic part, for example. Referring to FIGS. 2 and 4, the skirt 5 may include a trough 15 to accommodate the lower edge 25 of the heat removal device 4. As discussed below, a gap may be provided between each of the perimeter side surfaces 18a-18d of module 2 and a respective upper interior side surface 17a-17d of heat removal device 4.

In the example embodiments shown in FIGS. 1, 2 and 4, the skirt 5 may be dimensioned so that, when installed, the distances between opposite pairs of skirt interior surfaces (e.g., between pairs 24a, 24b and 24c, 24d) may be equal to or greater than the distances between their respective pairs of upper interior side surfaces (e.g., surface pairs 17a, 17b and 17c, 17d).

Figure 6:
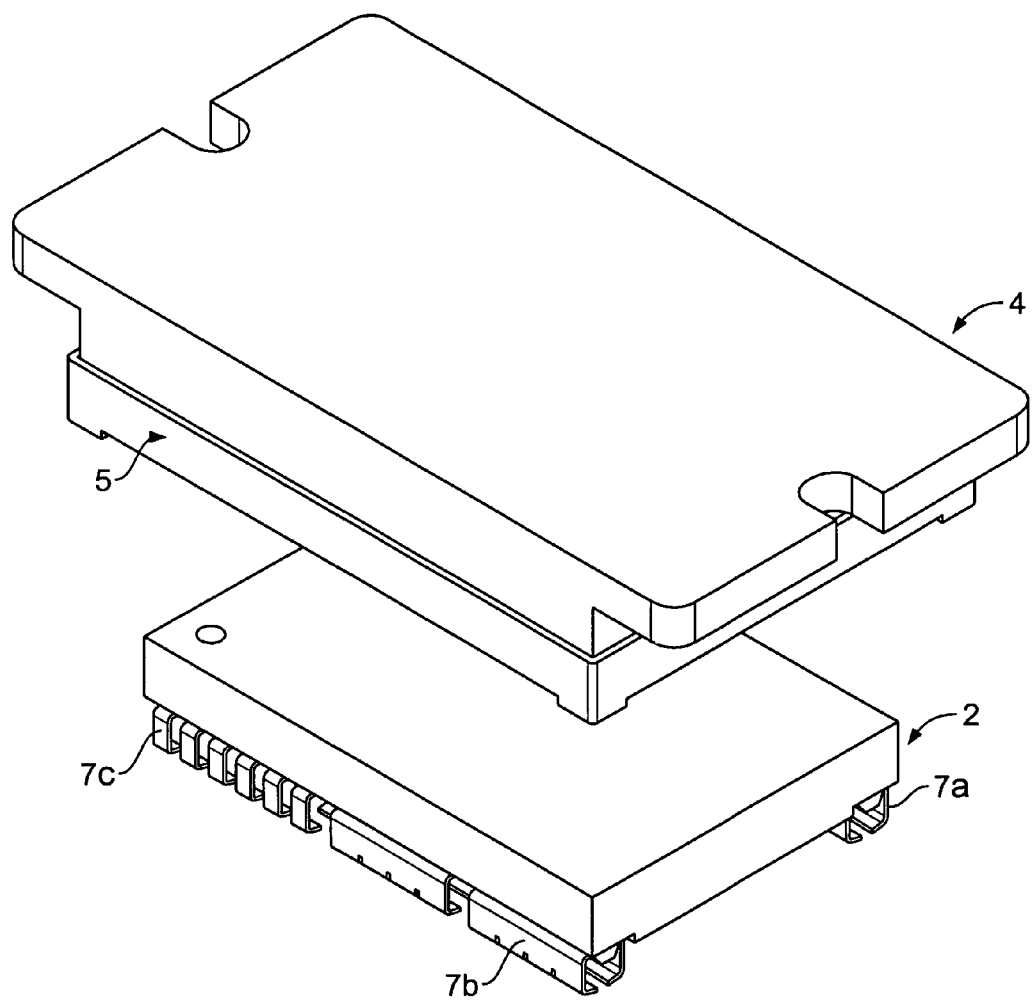
Figure 7:
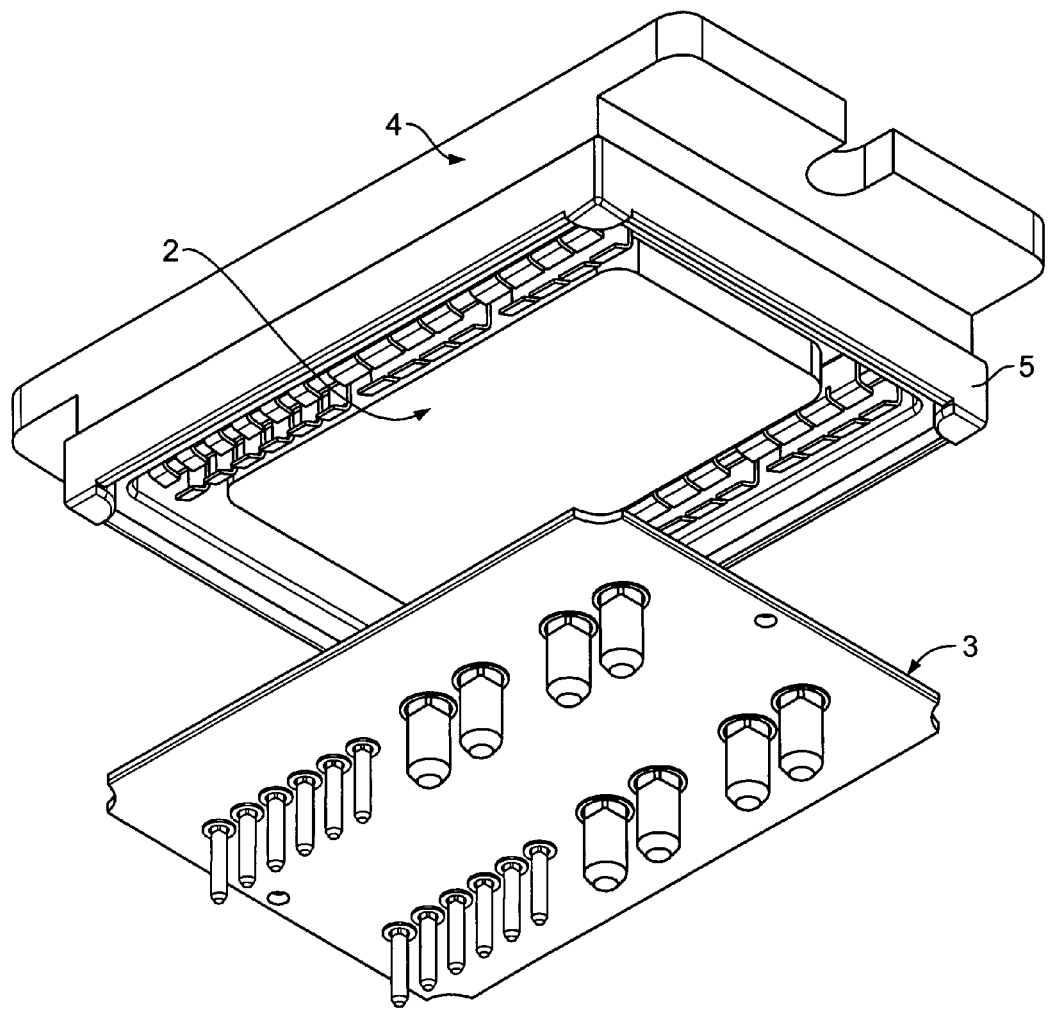
Figure 8:
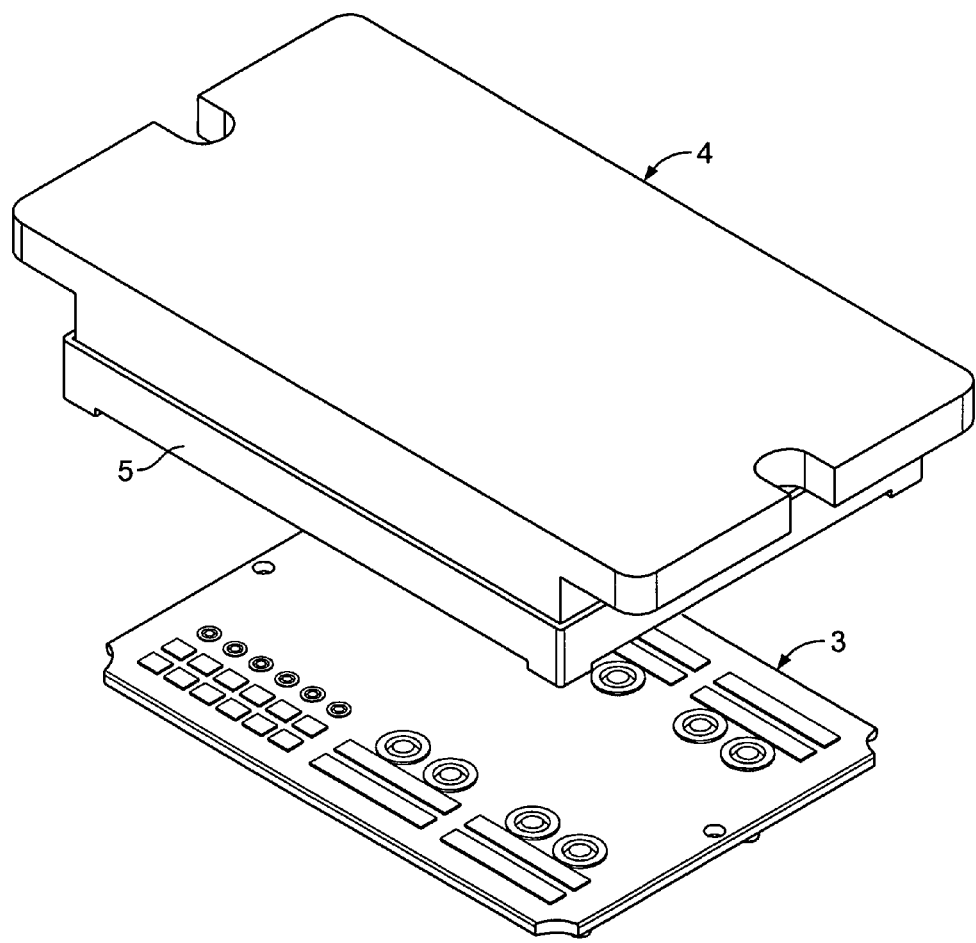

FIGS. 5 and 6 show exploded, perspective, views in which a partial assembly (comprising the skirt 5 mated with the heat removal device 4) is shown juxtaposed to the removed module 2. FIGS. 7 and 8 are exploded, perspective, views in which a partial assembly (comprising the module 2 in the cavity 6 and the skirt 5 mated with the heat removal device 4) is shown juxtaposed to the removed PCB 3. The fully assembled exemplary power converter assembly 1 is as depicted in FIG. 3. The module 2 is enclosed within the assembly and is not visible in the drawing.

Figure 9:
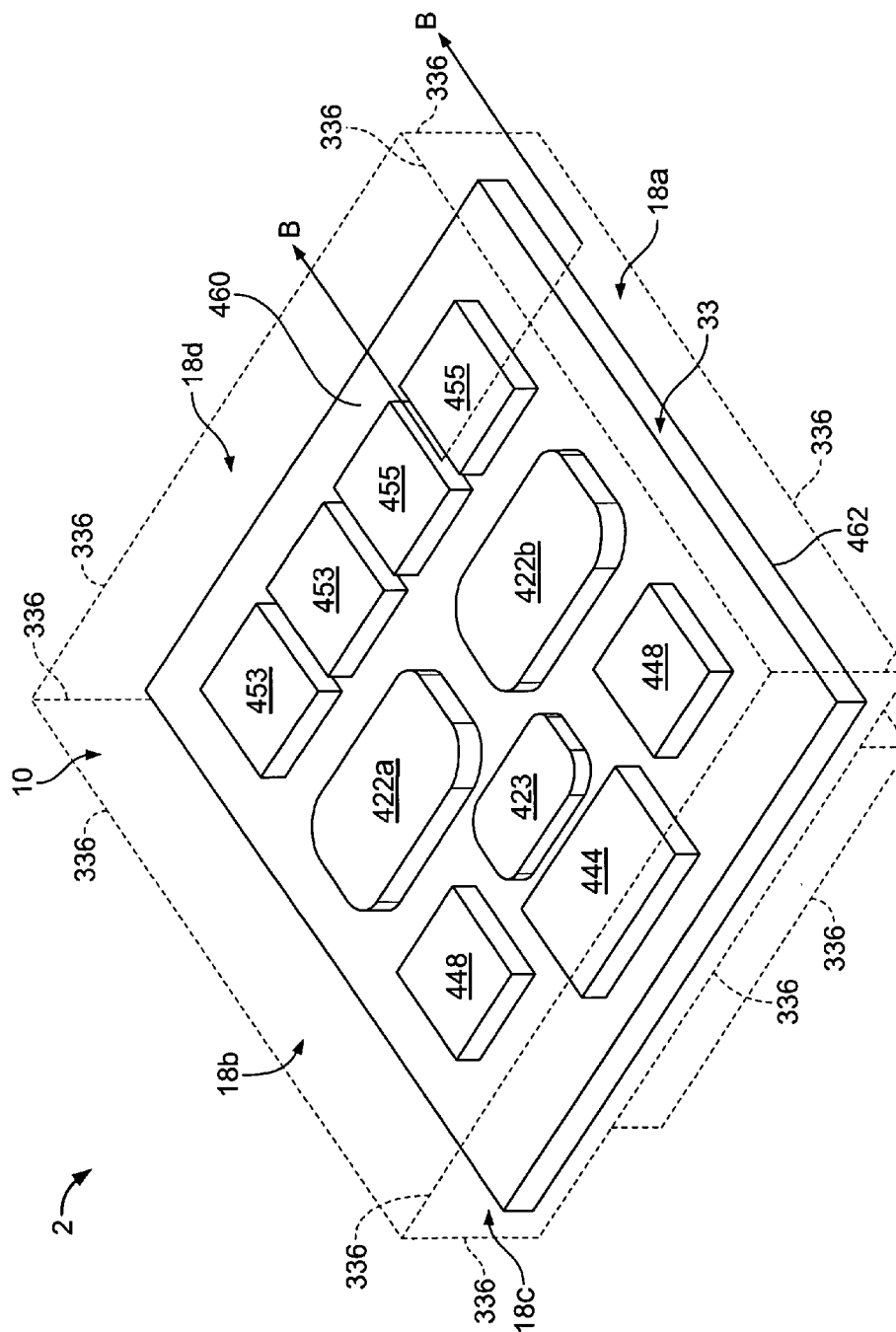
FIG. 9 shows a phantom view of an illustrative electronic module.

FIG. 9 shows a phantom view of an illustrative electronic module, which is depicted in this example as the electronic module 2. In some embodiments, the module 2 may be of the kind described by Vinciarelli et al., Power Converter Package and Thermal Management, U.S. Pat. No. 7,361,844, issued Apr. 22, 2008, the entire disclosure of which is incorporated herein by reference. As depicted in FIG. 9, the module 2 includes an internal substrate 33 and electronic components 422a, 442b, 423, 444, 448, 453, 455 mounted (e.g., by solder, not shown) onto a top surface 460 of a PCB 33. In some embodiments, additional components may also be mounted to a bottom surface 462 of the internal substrate 33.

As indicated by the dashed lines 336 in FIG. 9, the internal substrate 33 and all the electronic components may be encapsulated with a molding that, after curing, forms the exterior surfaces of the module 2. The terminals 7 are omitted from the drawing in FIG. 9 for the sake of clarity.

In general, some of the components in the module 2 may dissipate significantly more heat than others and thus may be considered "heat dissipating" components. Using the power converter module 2 as an example, the predominant heat dissipating components may include electronic switches 453, synchronous rectifiers 455 (e.g., MOSFETs), and transformer cores 422a, 422b. To facilitate heat removal, a thermally conductive molding compound such as the EME-760B epoxy resin molding compound, manufactured by Sumitomo Bakelite Co. Ltd., Tokyo, Japan may be used to help conduct heat from the heat generating components inside of the module primarily to the nearest exterior surface 10, 19, 18a-18d of the module 2.

In addition to providing electrical connections between internal components and the terminals, the internal substrate 33, which may be a PCB, may be constructed to conduct heat from the heat generating devices inside the module laterally through the module to the perimeter side surfaces 18a-18d. By way of example and not limitation, the following features may advantageously promote heat transfer to selected exterior surfaces of the module 2: increasing the thickness of the conductive layers (e.g., 2 oz. copper or heavier); increasing the number of conductive layers (e.g. 6 or 14 conductive layers); minimizing the etched areas of each conductive layer, or a combination of these features. Such features may provide additional heat removing capacity for the module in areas where the internal substrate 33 is substantially proximate the perimeter side surfaces 18a-18d. In various embodiments, the terminals 8a, 8c may also be used to conduct substantial heat out of the module 2.

Figure 10:
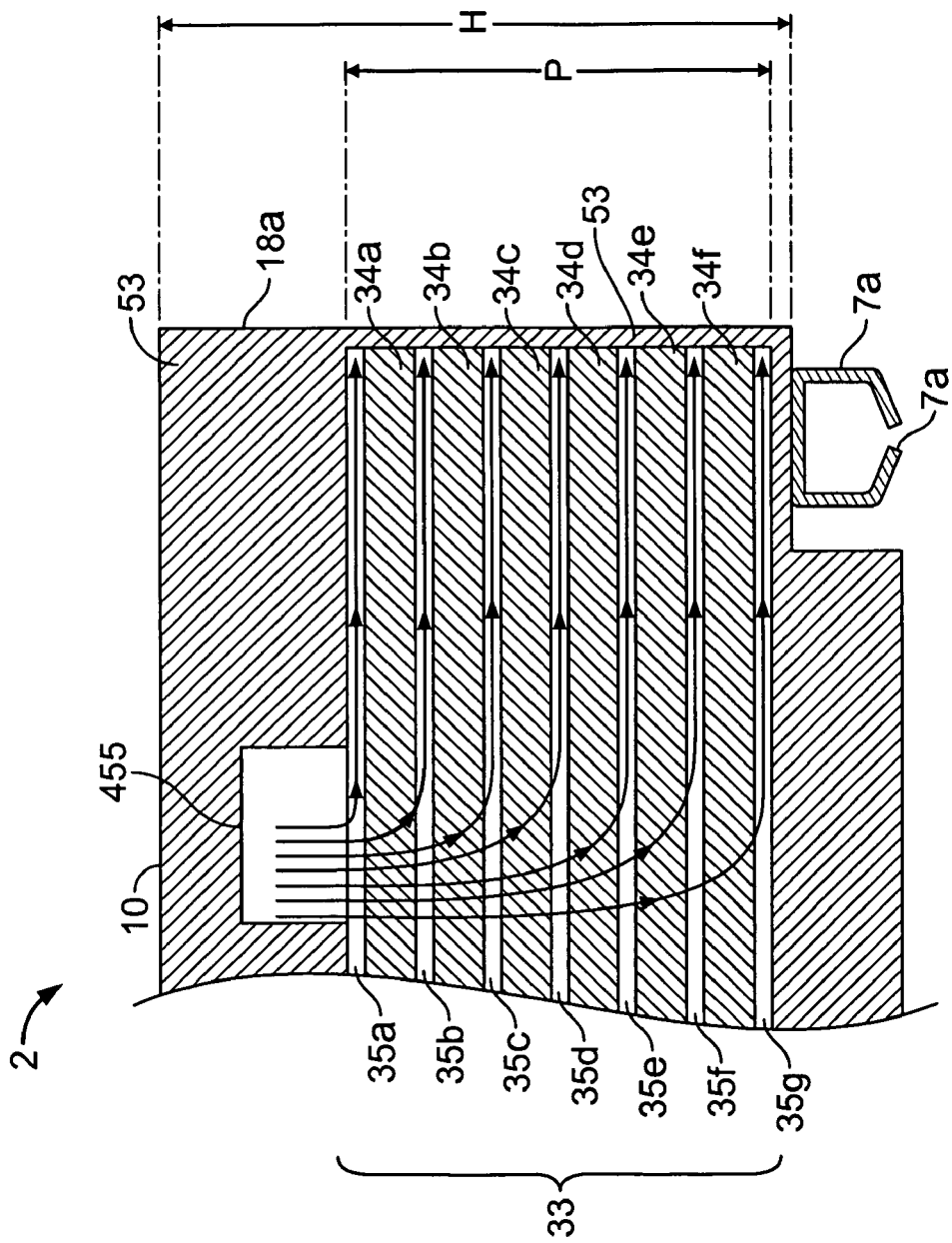
FIG. 10 shows a partial cross-sectional view taken along line B-B of FIG. 9.

FIG. 10 shows a partial cross-sectional view taken along line B-B of FIG. 9 to illustrate heat transfer through the substrate 33. In FIG. 10, the substrate 33 is shown as a multilayer PCB comprising alternating metallization layers 35a-35g and insulation layers 34a-34f. The metallization layers may be arranged, for example, to form electrical connections among internal components and the module terminal 7a. The metallization layers may also be arranged to aid in conduction of heat from internal components to one or more of the perimeter side surfaces of the module 2. For example, the wavy lines in FIG. 10 illustrate heat being conducted away from heat-generating component 455 toward outer peripheral side surface 18a, generally by the substrate 33 and more specifically through the conductive layers of the PCB. As shown in FIG. 10, the substrate 33 will conduct heat most effectively to the portion of the perimeter side that is adjacent its edge. In some embodiments the substrate may be exposed actually forming part of the respective perimeter side wall, while in other embodiments such as that shown in FIGS. 9 and 10, the substrate edge may be covered by the molding compound. If as shown in FIG. 10, the height of perimeter side 18a is H and the height of substrate 33 is P, and the substrate extends essentially the entire length of the module, then the area of the perimeter surface 18a to which heat will be most effectively coupled by the substrate will be approximately equal to (P/H) *100 percent of the total area of perimeter surface 18a. This selected area of the side wall, may be expanded if desired beyond the thickness of the substrate as shown in FIG. 10, for example using a heat spreading component (not shown) along the perimeter wall of the module.

The heat removal device 4 (FIGS. 1-8) may advantageously provide an effective thermal connection with a large percentage by area of perimeter sidewalls, as shown in the cross section of FIG. 4. The heat removal device 4, which provides heat removal paths from the perimeter side surfaces in addition to the top surface 10 of the module 2, may reduce the overall module thermal impedance, for example, between internal heat-generating components and external ambient air, or between internal heat-generating components and/or an external cold plate. Combined lateral and vertical heat transfer may, in some embodiments, yield a substantially reduced thermal impedance.

In various embodiments, the degree of improvement in thermal impedance may depend, in part, on the outer dimensions of the module and the efficiency with which heat can be conducted to the peripheral side surfaces of the module by the internal substrate 33, and the area of the perimeter side walls that is thermally coupled to the heat removal device 4. Contemporary multilayer PCBs may carry heat efficiently from heat-generating components mounted on their upper and lower surfaces to their peripheral edges, as illustrated in FIG. 10. For example, a PCB may comprise 4 metallization layers, each being at least 2.2 mils (0.056 mm) thick, and three insulation layers, or it may comprise 6 metallization layers and 5 insulation layers or 14 metallization layers and 13 insulation layers.

Referring to FIGS. 1, 2 and 4, heat that is conducted from module top surface 10, and from one or more of the perimeter side surfaces 18*a*-18*d* of the module 2, into the heat removal device 4 must pass through a small gap 38 (FIG. 4). The gap 38 may be filled with a thermally conductive substance (e.g., thermally conductive paste, thermally conductive encapsulant) to substantially reduce the thermal impedance. The material used to fill the gap 38 may also provide structural support to adhere the heat removal device to the module. As shown in the figures, each interior surface of the heat removal device 4 is in substantially close proximity to a corresponding surface on the module (e.g., interior top surface 11 corresponds to the module top surface 10, interior side surfaces 17*a*-17*d* correspond to, respectively, perimeter side surfaces 18*a*-18*d*). Corresponding surfaces through which heat will be removed may be closely matched in shape (referred to herein as "matched surfaces"). In some embodiments, the gap between cavity interior and module exterior surfaces may be substantially small and/or substantially uniform. The thermally conductive substance is preferably placed between matched portions of the top and perimeter surfaces to enhance the thermal connection and optionally also provide mechanical integrity.

In an illustrative example, the power converter assembly 1 of FIG. 1 may include a module 2, such as a model V048F120T025 power converter module manufactured by Vicor Corporation, Andover, Mass., USA. The referenced module has an exterior shape of the kind shown for module 2 in FIG. 5 and has dimensions L=1.26 inch (32.5 mm), W=0.87 inch (22.0 mm) and H=0.17 inch (4.3 mm). The area of the module top surface is 715 mm²; the total area of the perimeter surfaces is 469 mm². Because the total surface area of the perimeter surfaces is equal to 65.5% of the area of the top surface, use of the heat transfer device 4 to remove heat from the perimeter surfaces, as described above, may contribute to a reduction in the overall module thermal impedance. An internal substrate, comprising a PCB with a plurality of metallization and insulating layers, carries heat to the four perimeter side surfaces of the module, the thickness of the substrate defining the selected area of the perimeter surfaces. For the referenced device the selected area is approximately 50% of the total perimeter surface area. With reference to FIG. 4, the inner top surface 11 of the heat removal device 4 matches substantially the entire top surface 10 of the module. The upper interior side surfaces of the heat removal device are brought down sufficiently far so that they match most, if not all, of the total perimeter surface area (approximately 75% match shown in FIG. 4) and most, if not all, of the selected area of the perimeter side surfaces (at least 50% match shown in FIG. 4) of the module. Thus, the matched portion of the total perimeter surface area is approximately 49.1% of the module top surface area. The interior surface of the heat removal device, including the total area of the inner top surface 11 and the interior perimeter surfaces 16*a*-16*d*, 17*a*-17*d*, receives at least 50% of the total surface area of the module. As described, the module thermal impedance may be improved, relative to the module thermal impedance that might be achieved if only the top surface were used for heat removal, by 30% or more depending upon the module. It will be appreciated that other configurations may provide higher or lower figures of merit for the thermal improvement.

In an illustrative example, the power converter assembly 1 of FIGS. 1-8 may include a "double sized" power converter module, such as those manufactured by Vicor Corporation, Andover, Mass., USA. The double-sized module may have an exterior shape similar to that shown for module 2 in FIGS. 1-8 with the following approximate dimensions L=1.26 inch (32.5 mm), W=1.74 inch (44.0 mm) and H=0.17 inch (4.3 mm). In this example, the area of the module top surface is 1430 mm² and the total area of the perimeter surfaces is 658 mm². Because the total surface area of the perimeter surfaces is equal to 46% of the area of the top surface, use of the heat removal device 4 to remove heat from the perimeter surfaces, as described above, may contribute to a reduction in the overall module thermal impedance. An internal substrate, comprising a PCB with a plurality of metallization layers and insulating layers, carries heat to the four perimeter side surfaces of the module, the thickness of the substrate defining the selected area of the perimeter surfaces (as defined above); for the double-sized device the selected area may also be approximately 50% of the total perimeter surface area. With reference to FIG. 4, the inner top surface 11 of the heat removal device 4 substantially matches the entire top surface 10 of the module and the upper interior side surfaces of the heat removal device are brought down sufficiently far so that they match approximately 75% of the total perimeter surface area and at least 50% of the selected area of the perimeter side surfaces of the module. Thus, the matched portion of the total perimeter surface area is approximately 34.5% of the module top surface area. The interior surface of the heat removal device, comprising the total area of the inner top surface 11 and the interior perimeter surfaces 16*a*-16*d*, 17*a*-17*d*, receives at least 50% of the total surface area of the module.

Referring to FIGS. 1 and 4, the skirt 5 may incorporate alignment features for aligning the intermediate module and PCB assembly relative to the heat removal device. For example, a notch 27 may be provided along the lower edge of the skirt 5 or receiving the outer edges 29*a*-29*d* of the PCB 3. Alignment posts 51 may also be provided on the corners of the skirt to correspond to cutouts 52 at the corners of the PCB 3. Therefore in addition to providing electrical insulation between the module terminals and the cavity walls, the skirt 5 may also promote proper positioning or spacing relative to the cavity.

Figure 11:
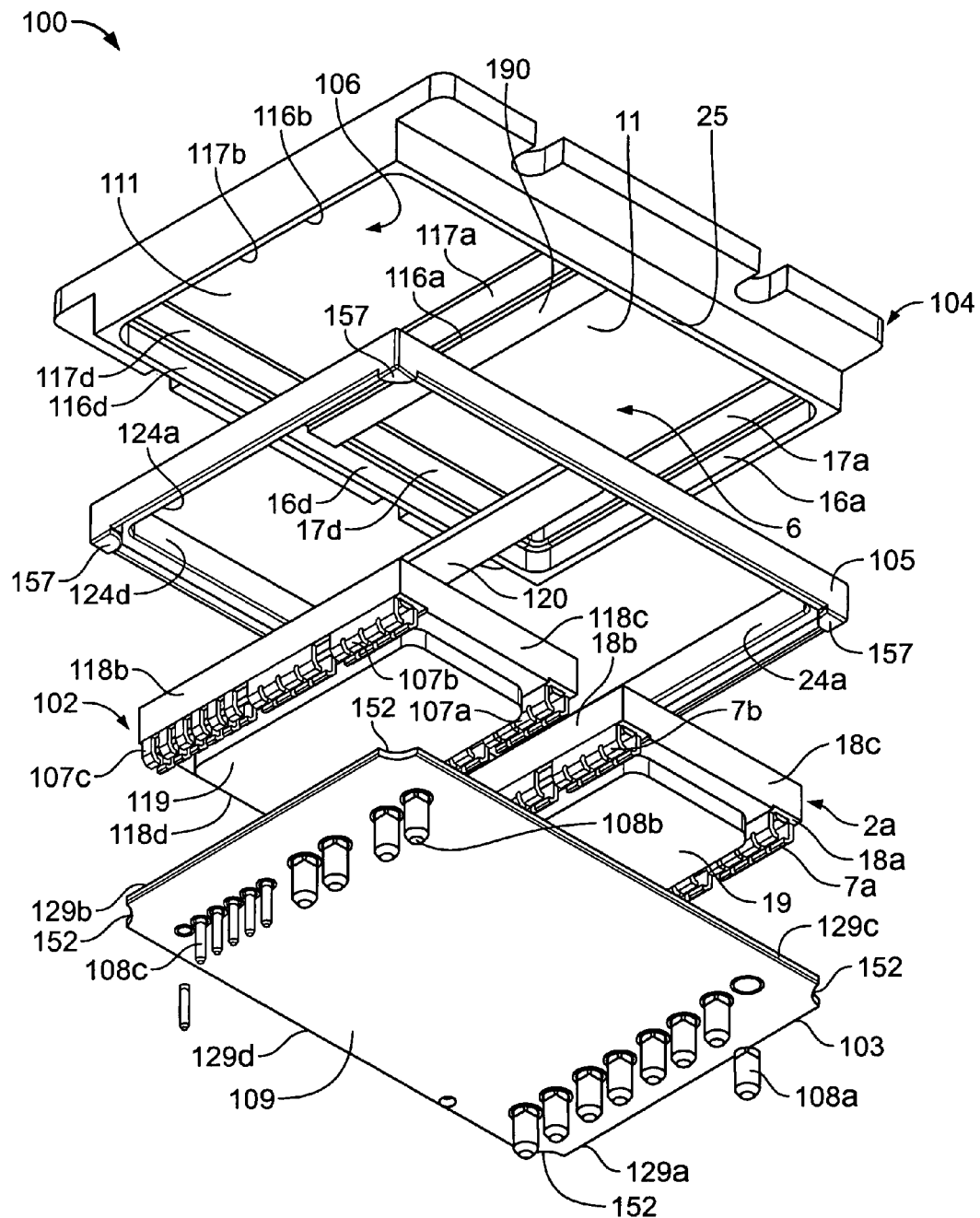
FIGS. 11 and 12 show exploded, perspective, views of an exemplary electronic assembly that includes multiple electronic modules and a heat removal device.
Figure 12:
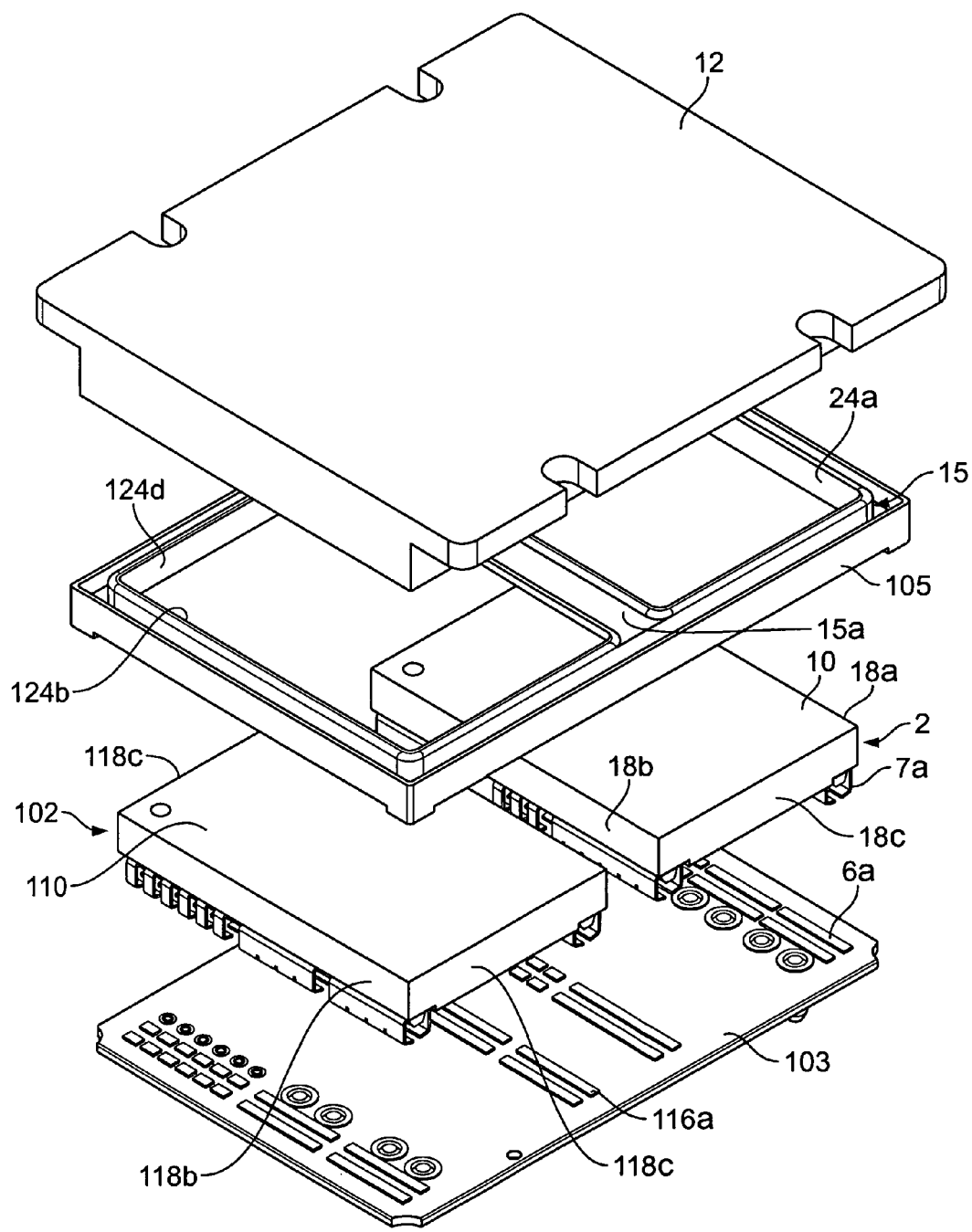
Figure 13:
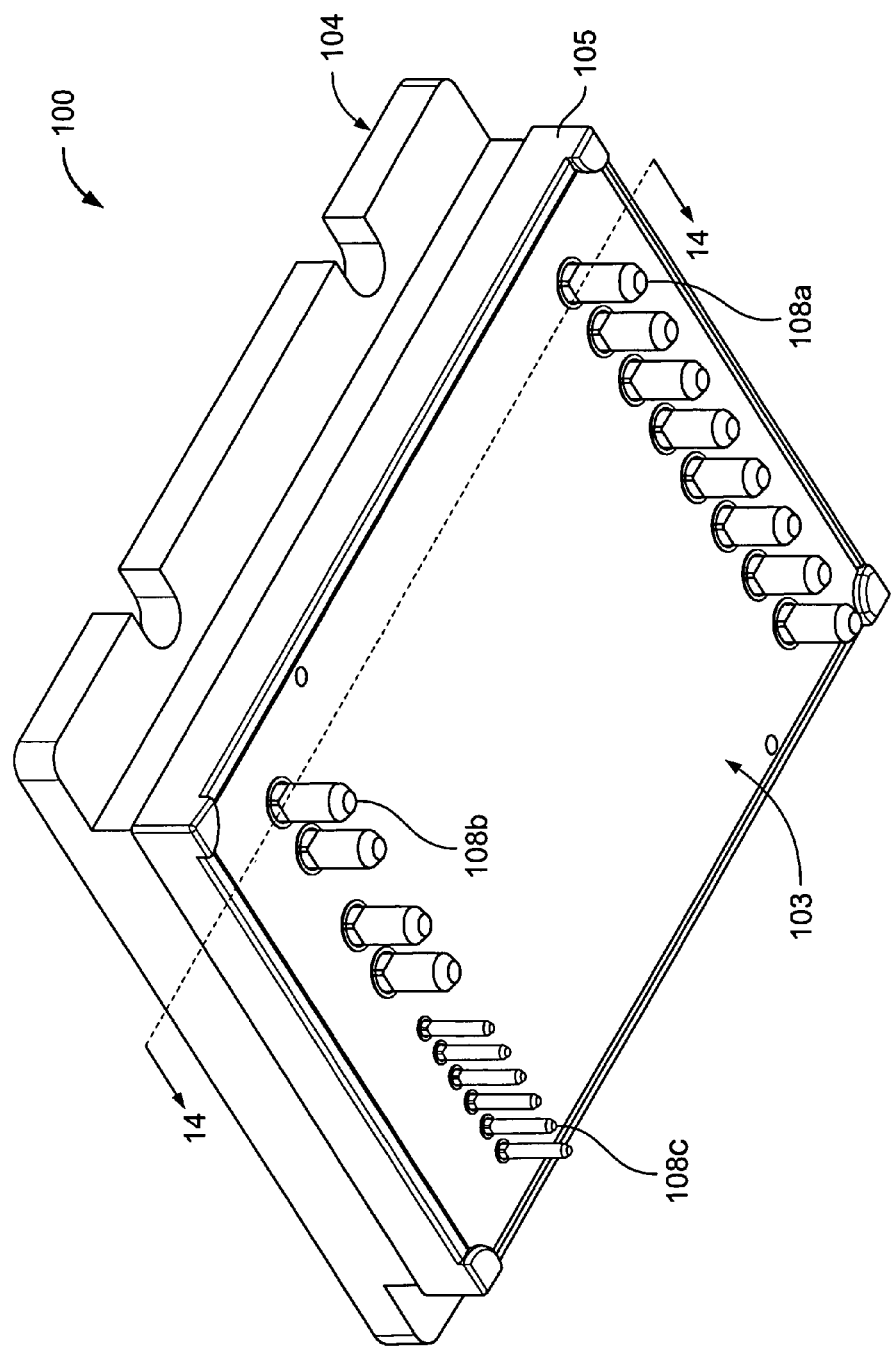
FIG. 13 shows a perspective view of the apparatus of FIGS. 11 and 12.
Figure 14:
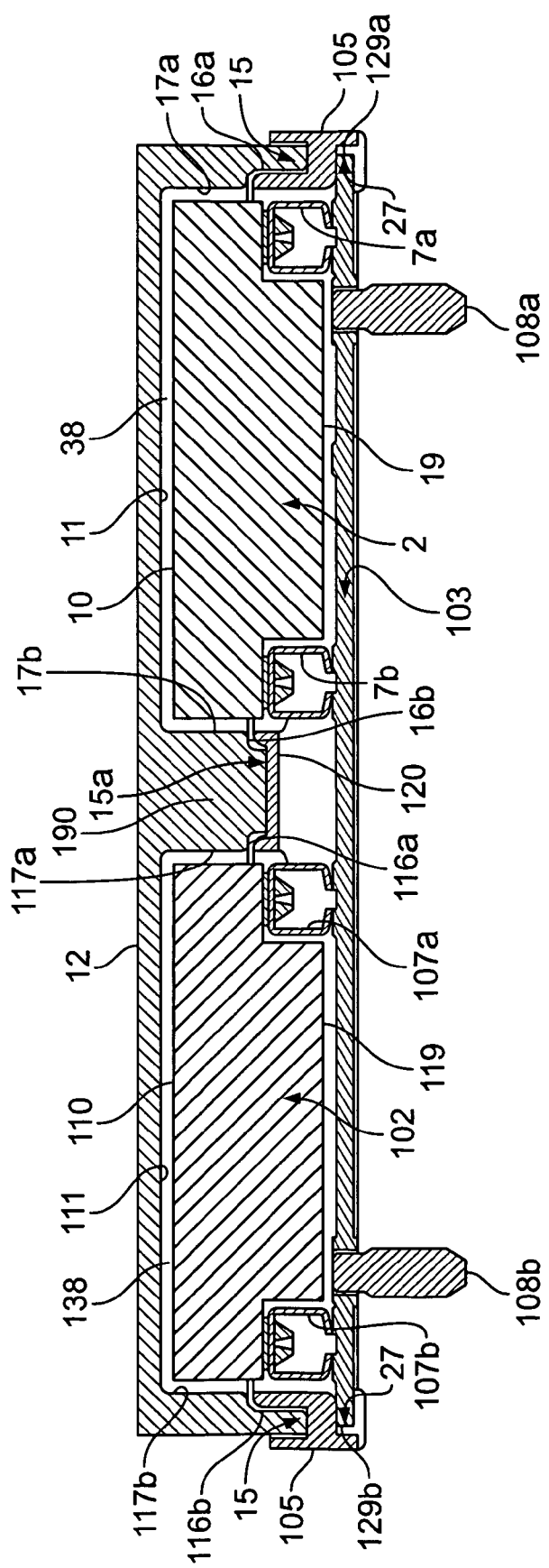
FIG. 14 shows a cross-sectional view of the apparatus of FIG. 13.

FIGS. 11 and 12 show exploded, perspective, views of an exemplary power converter assembly 100 that includes an exemplary arrangement of multiple electronic modules 2, 102 and a heat removal device 104. FIG. 13 shows a perspective view of the fully assembled power converter 100. FIG. 14 shows a cross-sectional view (taken along line C-C in FIG. 13). FIGS. 15-18 show exploded, perspective views to illustrate an exemplary assembly sequence for the power converter assembly 100.

Similar to the power converter assembly 1 described above with reference to FIGS. 1-8, the depicted power converter assembly 100 includes a printed circuit board (PCB) 103, a heat removal device 104, and an electrically insulating skirt 105. The power converter assembly 100 differs from the apparatus 1, for example, in that the power converter assembly 100 is configured to include two electronic power conversion modules 2, 102 and the heat removal device 104 includes two corresponding cavities 6, 106.

The modules 2 and 102 in apparatus 100 may be substantially similar to the module 2 described above with reference to FIGS. 9 and 10. In an illustrative example, the modules 2, 102 may each include: internal heat-dissipating components; thermally conductive overmolding compound; and module terminals 7a-7c, 107a-107c arranged in rows along overhang surfaces, as previously described. In some embodiments, the modules 2, 102 may include an internal structure, such as the substrate 33, that conducts heat to selected areas along the perimeter sides 18a-18d, 118a-118d of the modules. The module terminals are connected to conductive pads 6a, 116a (FIG. 12) on the PCB 103. The conductive pads may connect to pins 108a-108c that are mounted to the bottom side 109 of the PCB 103.

The heat removal device 104 of FIGS. 11-18 is shown having two internal cavities 6, 106. Each of the cavities 6, 106 is configured to receive a respective one of the modules 2, 102. The heat removal device 104 is preferably made out of thermally conductive material, which may include, by way of example and not limitation, aluminum, copper, iron, metallic alloys, or combinations of these materials.

A wall 190 runs between the two cavities 6, 106. Referring to FIGS. 11, 12 and 14, each cavity 6, 106 comprises an interior surface having an interior top surface 11, 111 and interior side surfaces. The interior side surfaces of each cavity are stepped, each interior side surface including respective lower interior side surfaces 16a-16d and 116a-116d, and upper interior side surfaces 17a-17d and 117a-117d. In each cavity, opposite pairs of lower interior side surfaces (e.g., in cavity 6, surface pairs 16a, 16b and 16c, 16d; in cavity 106, surface pairs 116a, 116b and 116c and 116d) are spaced apart further than opposite pairs of upper interior side surfaces (e.g., in cavity 6, surface pairs 17a, 17b and 17c, 17d; in cavity 106, surface pairs 117a, 117b and 117c, 117d).

The skirt 105, which in some embodiments may be a molded plastic part, comprises a trough 15 (FIGS. 12, 14) that fits over the lower perimeter edges 25 of the heat removal device 104 and a second trough 15a that fits over the lower edge of the wall 190. A gap 38 is provided between each of the perimeter side surfaces 18a-18d of module 2 and its respective upper interior side surface 17a-17d on heat removal device 104. A gap 138 is provided between each of the perimeter side surfaces 118a-118d of module 102 and its respective upper interior side surface 117a-117d on the heat removal device 104. As shown in FIG. 14, and discussed above, the skirt 105 may be dimensioned so that, when installed, the distances between opposite pairs of skirt interior surfaces (e.g., between pairs 24a, 24b and 24c, 24d and between pairs 124a, 124b and 124c, 124d) are equal to or greater than the distances between their respective pairs of upper interior side surfaces (e.g., surface pairs 17a, 17b and 17c, 17d and surface pairs 117a, 117b and 117c, 117d).

Figure 15:
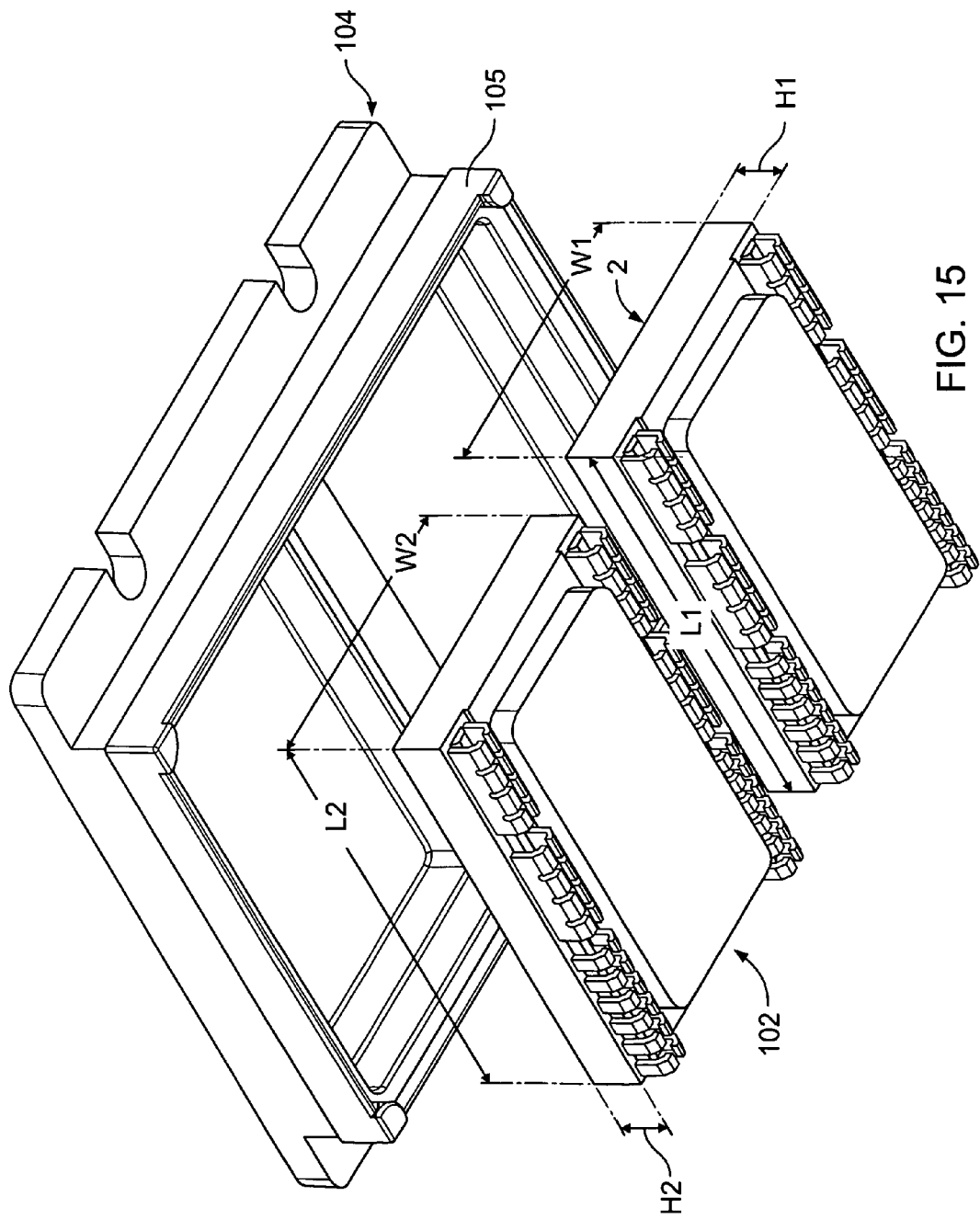
FIGS. 15 through 18 show exploded, perspective views of the apparatus of FIG. 13.
Figure 16:
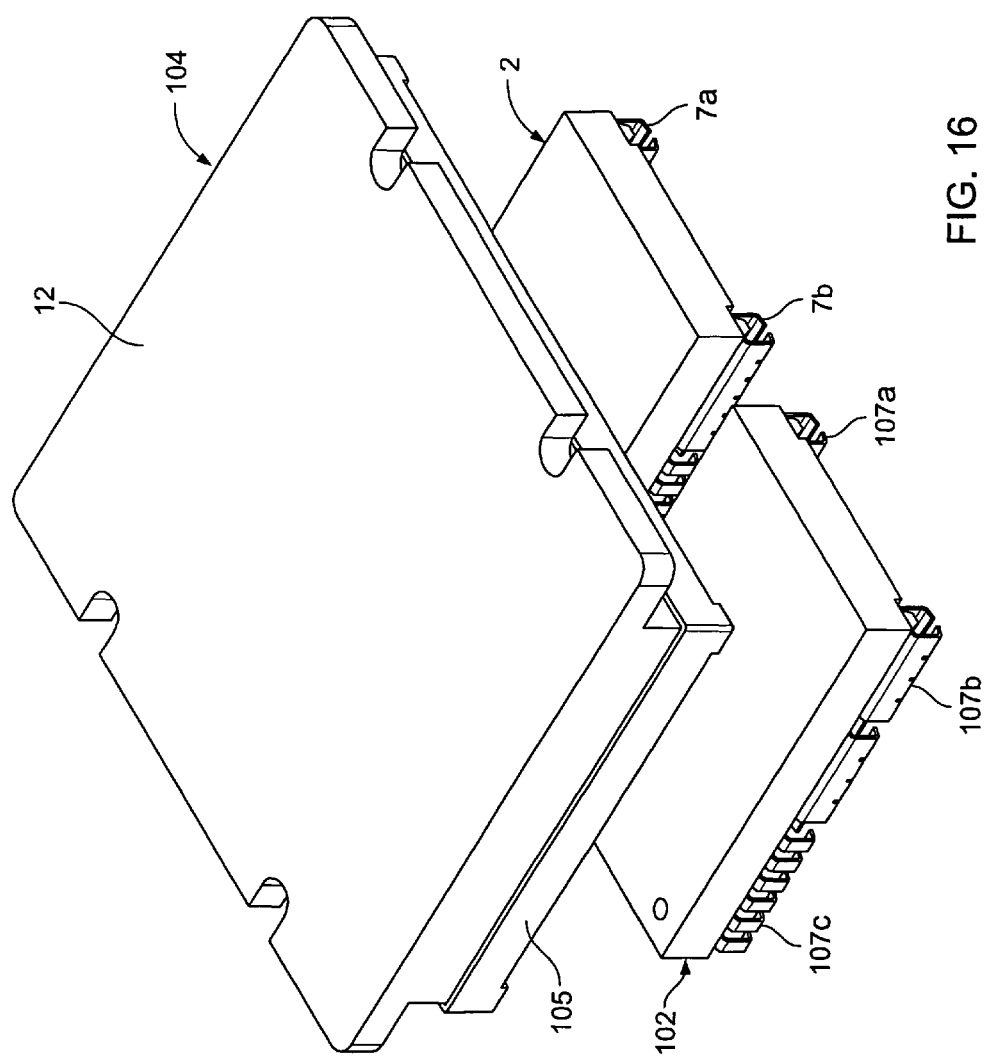
Figure 17:
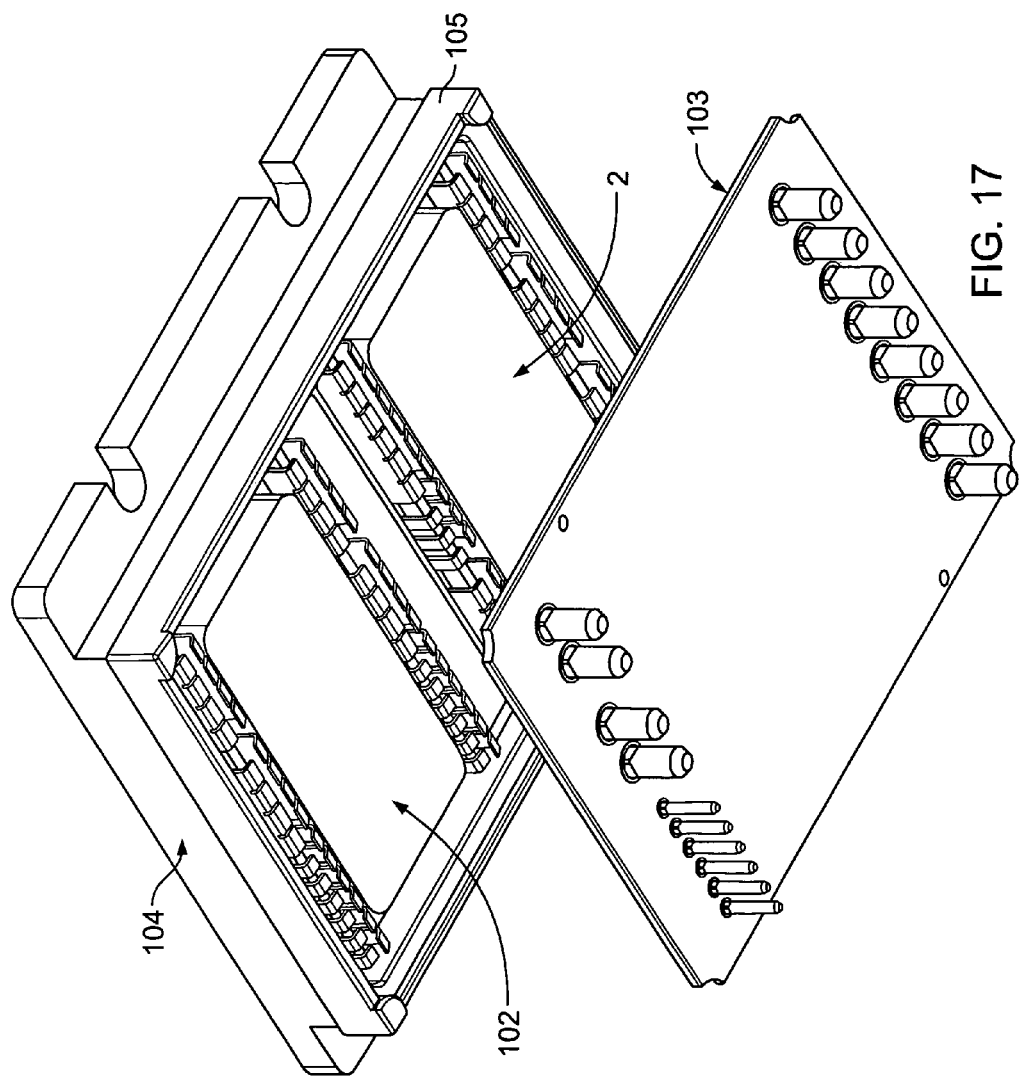
Figure 18:
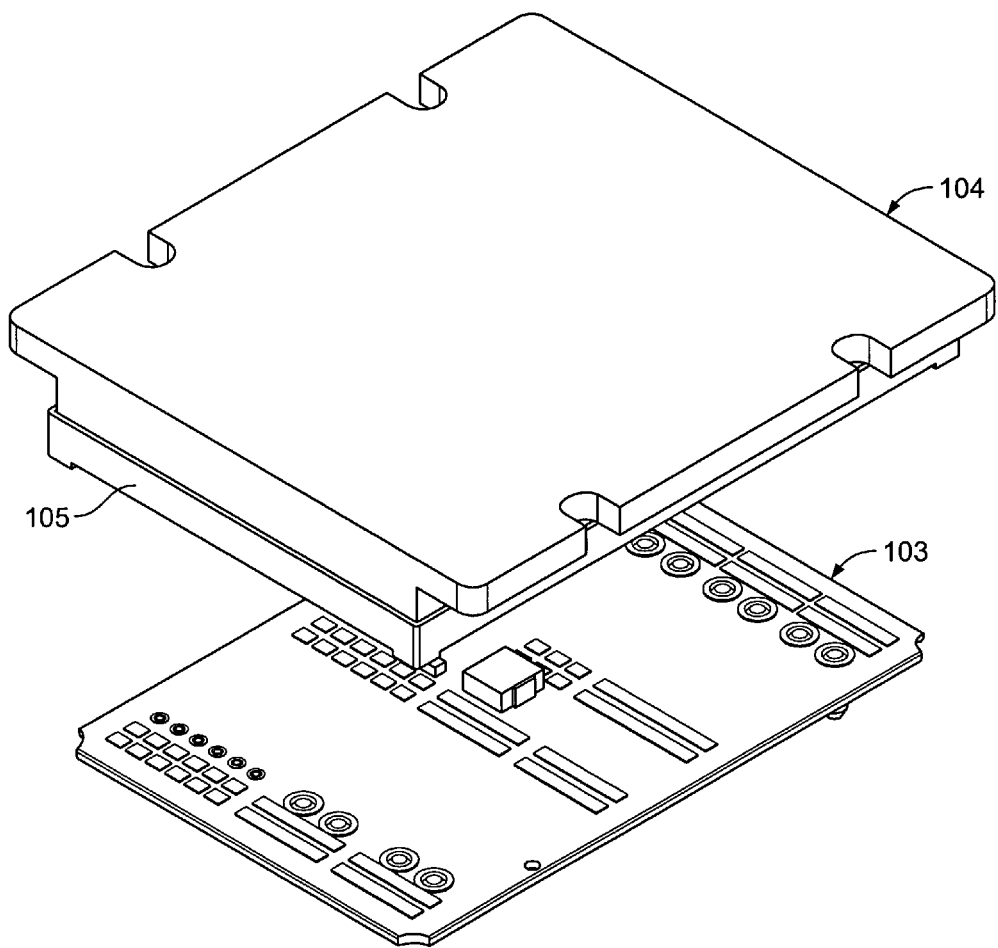

FIGS. 15 and 16 are exploded, perspective, views in which a partial assembly (comprising the skirt 105 mated with the heat removal device 104) is shown juxtaposed to the removed modules 2, 102. FIGS. 17 and 18 are exploded, perspective views, in which a partial assembly (comprising modules 2, 102 in the cavities 6, 106 and the skirt 105 mated with the heat removal device 104) is shown juxtaposed to the removed PCB 103. As can be seen from FIGS. 14 and 18, the wall 190 may not extend all the way down to the surface of the PCB 103, for example, to allow room for components to be mounted to the PCB 103 in the region under the wall 190. The fully assembled exemplary power converter assembly 100 is as depicted in FIG. 13. The modules 2, 102 are enclosed within the assembly and are not visible in the drawing.

Heat that is conducted from module top surfaces 10, 110, and from one or more of the perimeter side surfaces 18a-18d, 118a-118d of the modules 2, 102, into the heat removal device 104 must pass through a small gap 38 (FIG. 14). The gap 38 may be filled with a thermally conductive substance (e.g., thermally conductive paste, thermally conductive encapsulant) to minimize the thermal impedance of the gap. The material used to fill the gap may also provide structural support to adhere the heat removal device to the modules. In the depicted examples, each interior surface of each cavity of the heat removal device 104 is in proximity to a corresponding surface on a respective module (e.g., interior top surface 11 corresponds to module top surface 10, interior top surface 111 corresponds to module top surface 110, interior side surfaces 17a-17d correspond to, respectively, perimeter side surfaces 18a-18d, interior side surfaces 117a-117d correspond to, respectively, perimeter side surfaces 118a-118d).

Corresponding surfaces through which heat will be removed may be closely matched in shape (which may be referred to herein as "matched surfaces"), making the gap between them small. The thermally conductive substance is preferentially placed between matched portions of the top and perimeter surfaces.

The skirt 105 shown in FIGS. 11 and 14 may provide the same insulation and positioning functions discussed above in connection with FIGS. 1-8. For example, a notch 27 may be provided along the lower edge of the skirt 105 for receiving the outer edges 129a-129d of the PCB 103. Alignment posts 151 may also be provided on the corners of the skirt to correspond to cutouts 152 at the corners of the PCB 103.

Figure 19:
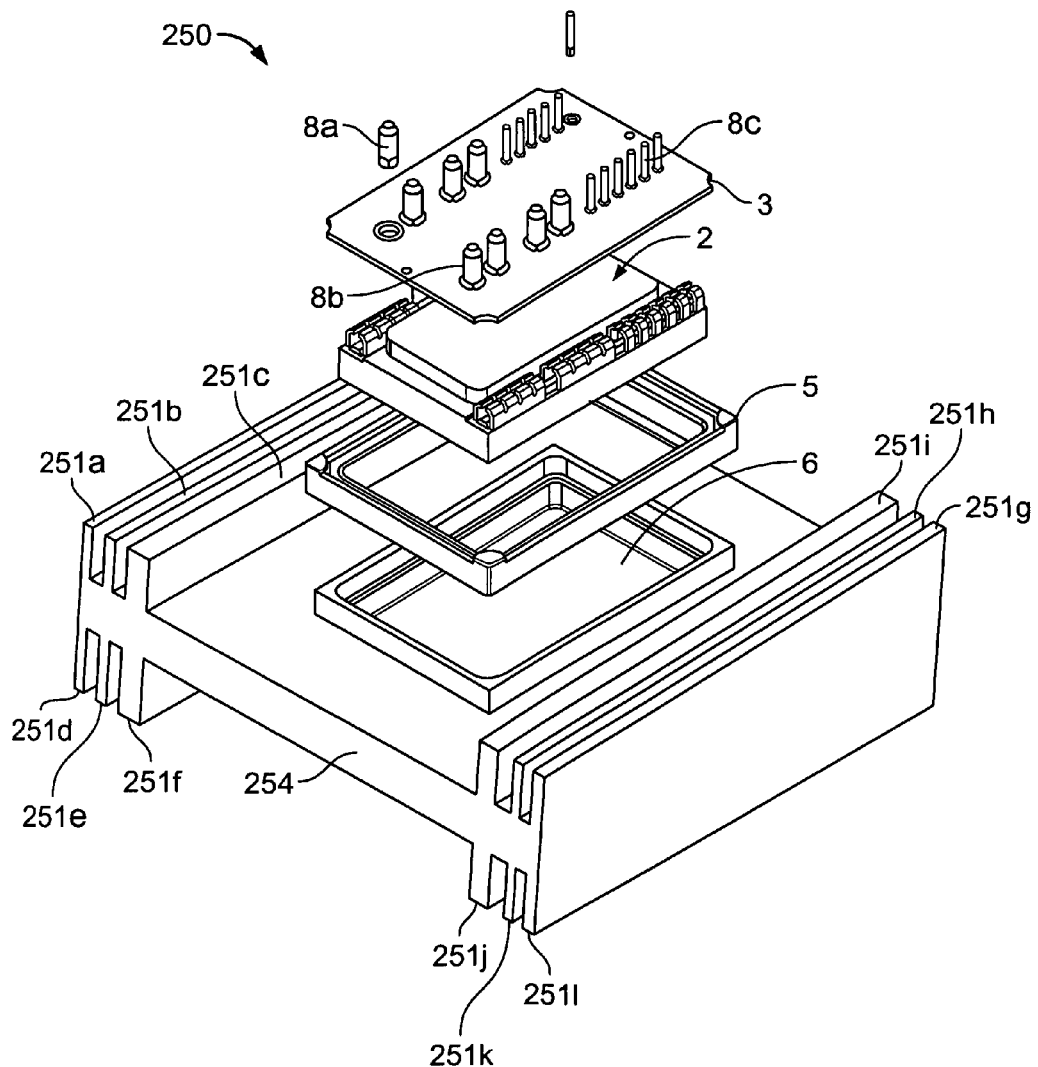
FIG. 19 shows an exploded, perspective, view of an exemplary electronic apparatus.

FIG. 19 shows another embodiment of an exemplary power converter apparatus 250. Like the power converter assembly 1 of FIGS. 1 through 8, the apparatus 250 comprises an electronic module 2, a printed circuit board (PCB) 3 comprising pins 8a, 8b, 8c, and an electrically insulating skirt 5. Apparatus 250 also comprises a heat removal device 254 comprising a cavity 6 and heat sinking fins 251a-251L. When used with comparable electronic modules 2, the apparatus 250 may have a lower overall module thermal impedance than the apparatus 1, in part owing to its relatively larger heat capacity and surface area. The apparatus 250 may be particularly well suited to applications that provide free convection or forced air cooling. The apparatus of FIG. 19 may also be modified to include a plurality of cavities and modules for example as introduced in the two-cavity-two-module example of FIGS. 11-18.

Figure 20:
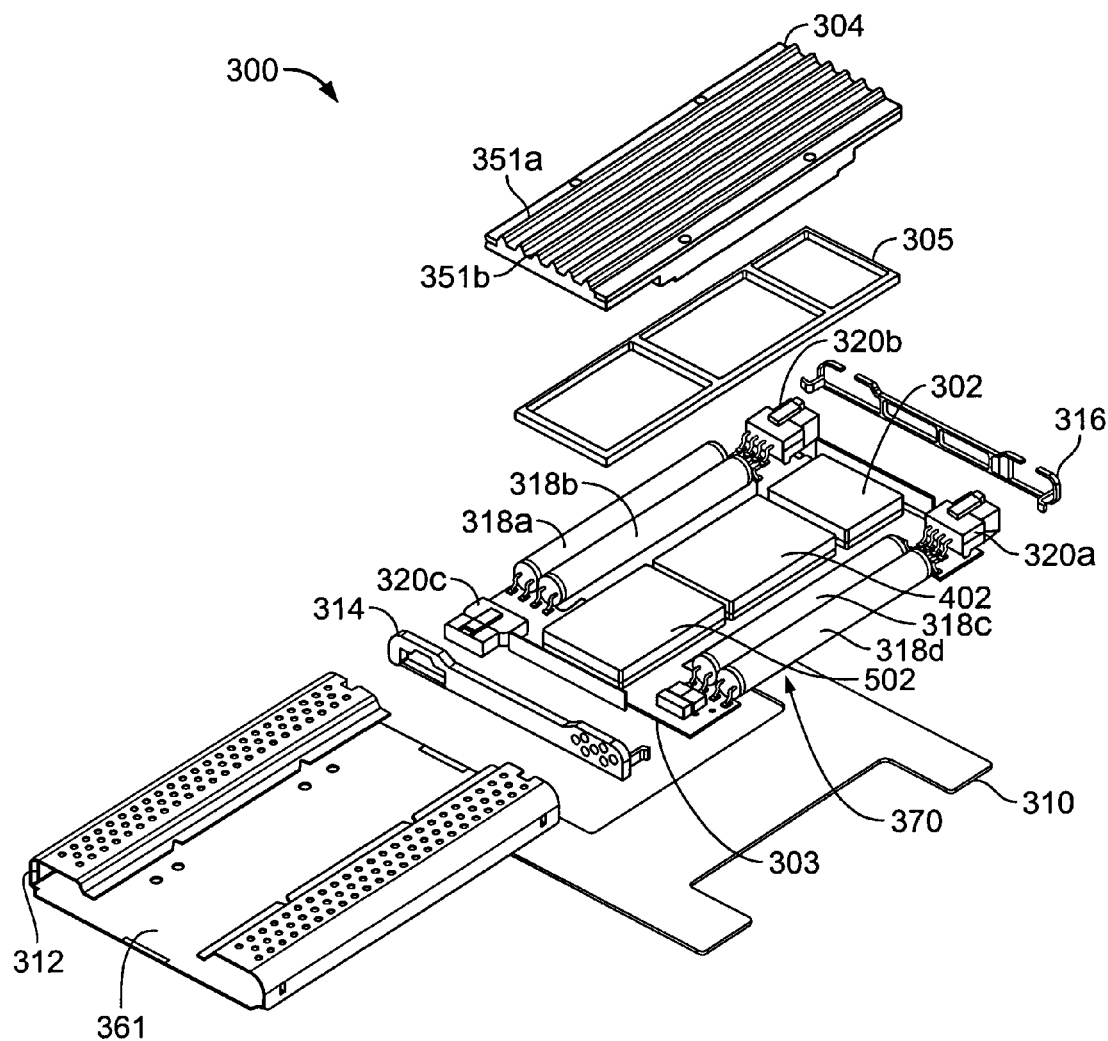
FIGS. 20 and 21 show exploded, perspective, views of an exemplary electronic apparatus.
Figure 21:
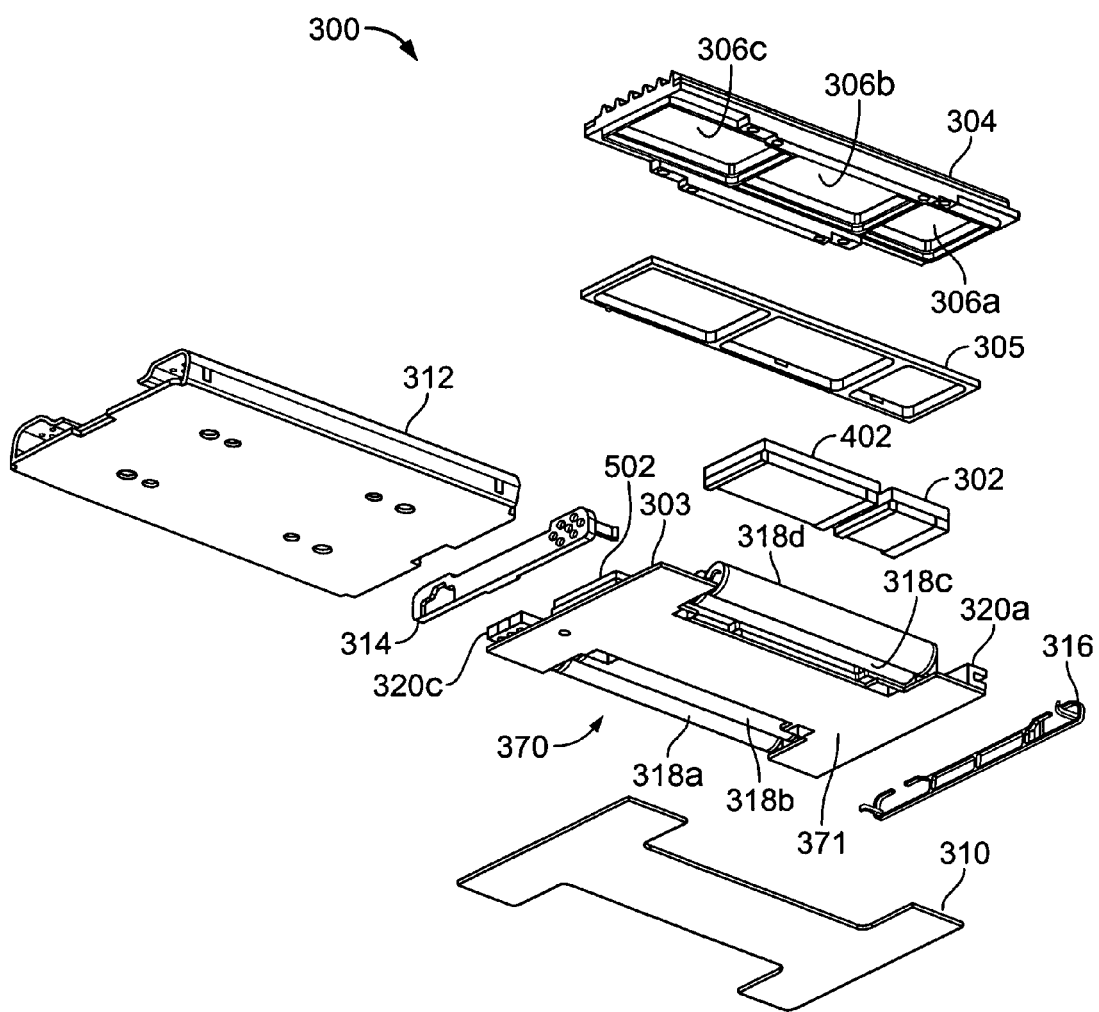

FIGS. 20 and 21 show partially exploded views of an embodiment of a power supply apparatus 300. As depicted, the exemplary power supply apparatus 300 comprises a printed circuit board assembly 370, a heat removal device 304, an electrically insulating skirt 305, a cover 312, end caps 314, 316 and insulator 310. The heat removal device 304, which is preferably made of thermally conductive material, comprises three cavities 306a-306c and fins (e.g., fins 351a, 351b). The printed circuit board assembly 370 comprises a printed circuit board 303, three electronic modules 302-304, filter capacitors 318a-318d and connectors 320a-320c. The power supply 300 may accept an AC utility line voltage input (e.g., 100-240 VAC, 50/60 Hz) via a connector (e.g., connector 320c) for delivery, via the PCB 303, to the input of an electronic module (e.g., module 502). Electronic module 502 may comprise rectification and filter circuitry and generate a unipolar voltage at its output. The unipolar voltage output of module 502 may be delivered, via PCB 303, to a front-end system module (e.g., module 402) that may perform the functions of isolation and transformation (e.g., the voltage delivered by the front-end system module may be galvanically isolated from the voltage at its input and the magnitude of the voltage delivered by the front-end system module may be scaled relative to the magnitude of the voltage at is input). The output of the front-end system module may be delivered, via PCB 303, to filter capacitors 381a-318d, which may perform both a filtering and an energy storage function. The filtered unipolar voltage across capacitors 381a-318d may be delivered, via PCB 303, to the input of a regulator system module (e.g., module 302) that delivers one or more regulated voltages at its outputs. The outputs of the regulator system module may be delivered, via PCB 303, to connectors (e.g., connectors 320a, 320b), to make the voltages available to external loads. In some embodiments, the modules 502, 302 may be co-located on the PCB 303.

Both the insulator 310 and the printed circuit board assembly 370 are installed into cover 312, the insulator preventing the bottom of PCB 303 from shorting to the inside lower surface 361 of the cover. Thereafter, the end caps 314, 316 may be installed.

Figure 22:
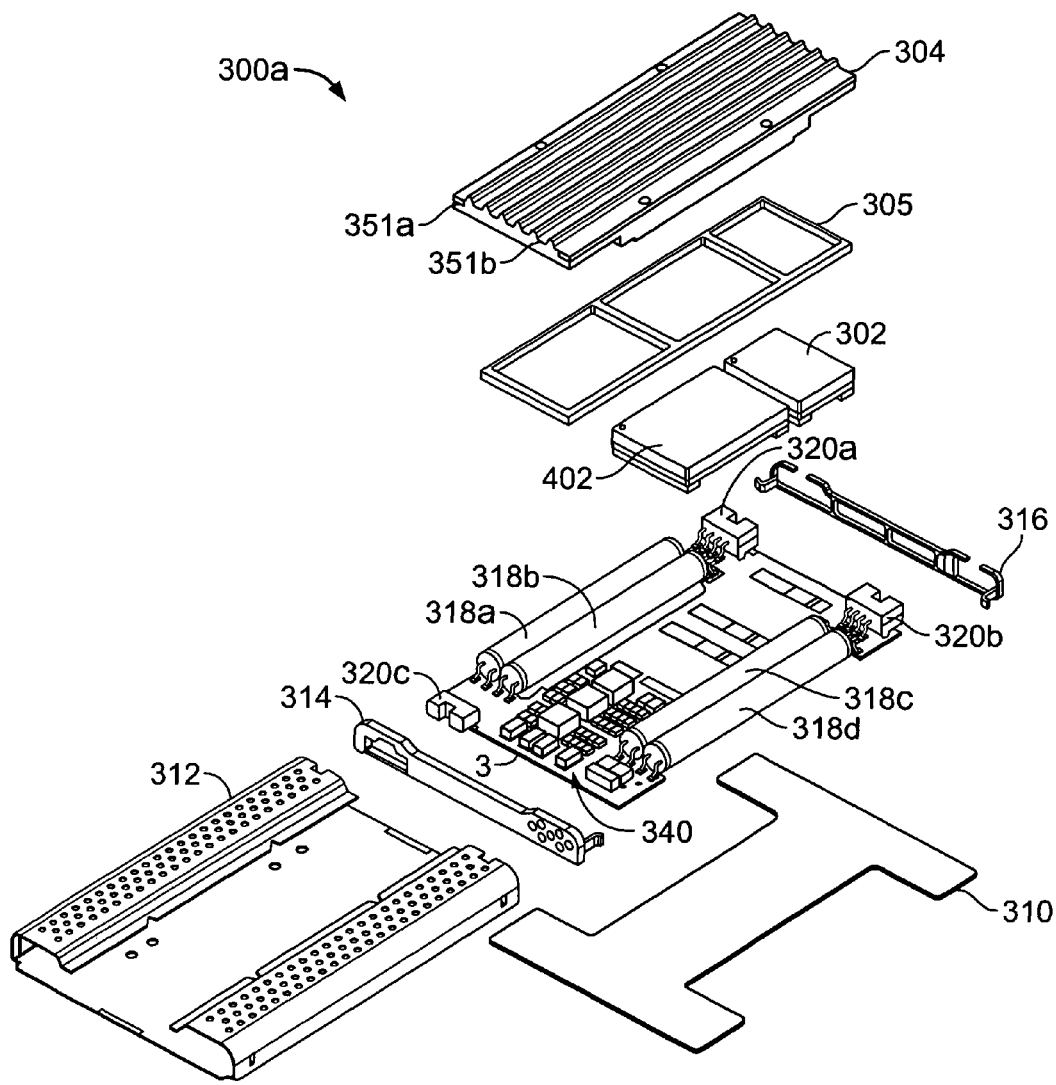
FIGS. 22 and 23 show exploded, perspective, views of an exemplary electronic apparatus.
Figure 23:
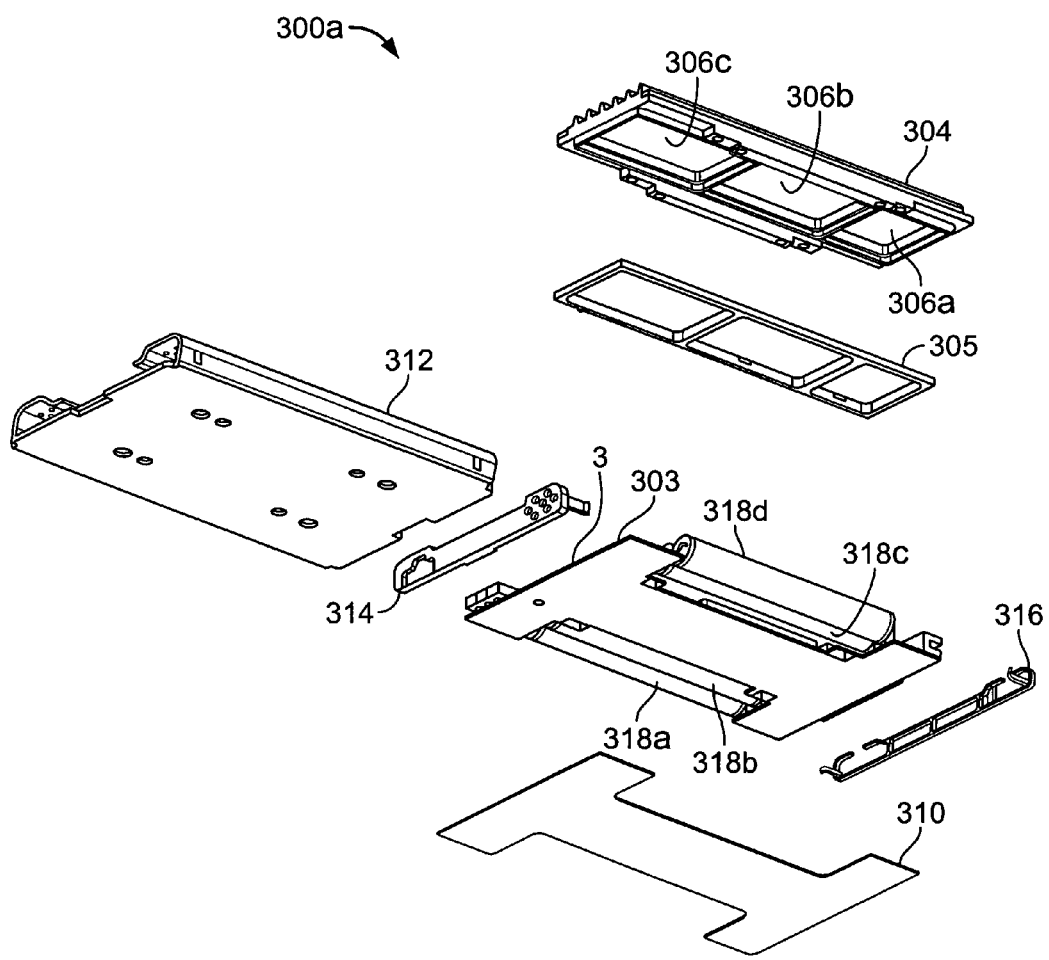

FIGS. 22 and 23 show partially exploded views of an exemplary embodiment of a power supply apparatus 300a. The power supply 300a is similar in description to the power supply 300 of FIGS. 20 and 21, except that the power supply of FIGS. 22 and 23 comprises a collection of discrete components 340 instead of the electronic module 502 of FIGS. 20 and 21.

Figure 24:
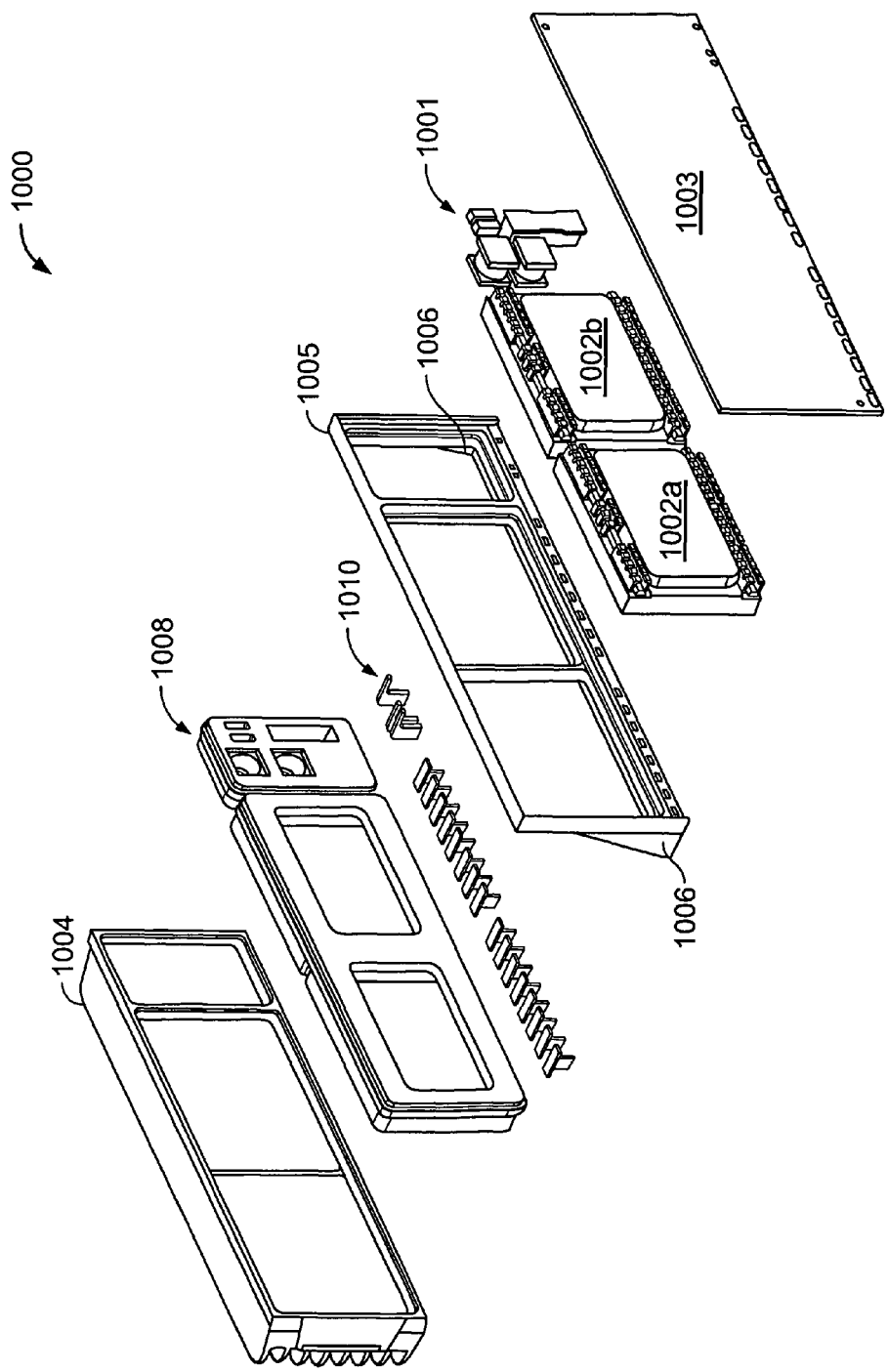
FIG. 24 shows an exploded, perspective view of an exemplary electronic assembly arranged to be installed in a vertical orientation.

FIG. 24 shows an exploded, perspective view of an exemplary embodiment of a power converter assembly 1000 arranged to be installed in a vertical orientation. In one illustrative example, one or more vertically-oriented power converter assemblies may be arranged for removable plug-in connection and mounting on a computer motherboard. In a vertically oriented installation, each power converter assembly may occupy a substantially reduced footprint area on the motherboard or other substrate.

As depicted in FIG. 24, the power converter assembly 1000 includes discrete electrical components 1001 and two heat-dissipating modules 1002a, 1002b. The electrical components may include, for example, discrete components (e.g., filter, fuse) alone or in combination with auxiliary devices that operate in cooperation with the modules 1002a, 1002b. The modules 1002a, 1002b may perform power processing operations, for example, to convert input power signals into one or more desired output power signals (e.g., regulated voltage and/or current). When assembled, the modules 1002a, 1002b are mounted to make electrical connections to a PCB 1003 that is integrated into the assembly 1000. In an illustrative example, the module 1002a may perform a rectification function to convert AC power signals to unipolar power signals. The module 1002b may process the unipolar power signals and output one or more regulated voltage signals, for example.

The assembly 1000 further includes a heat removal device 1004 to receive heat energy transferred from the modules 1002a, 1002b. The heat removal device 1004 has two cavities for receiving the modules 1002a, 1002b, and a cavity for receiving the electrical components 1001. In accordance with embodiments described above, interior surfaces of the cavities may be formed to substantially conform to the top and portions of the side surfaces of the modules 1002a, 1002b.

As depicted, the assembly 1000 includes an electrically insulating skirt 1005 that provides a frame for the modules 1002a, 1002b. The skirt 1005 may, for example, serve to substantially align the modules and/or serve to provide electrical isolation and/or electrical insulation barrier between portions of the heat removal device 1004 and the modules 1002a, 1002b. For example, the skirt 1005 may extend creepage and/or clearance distances from one or more of the electrical contacts (e.g., 120 VAC) on the module 1002a. The depicted skirt 1005 includes a vertical support member 1006 at each end to provide stability by increasing the effective base width of the skirt 1005. The member 1006 may support the modules 1002a, 1002b in a vertical orientation.

The assembly 1000 further includes an encapsulant 1008 which fills the voids between the modules 1002a, 1002b, the heat removal device 1004, and the insulating skirt 1005. In some examples, the encapsulant 1008 may substantially promote heat transfer from the modules 1002a, 1002b to the interior surfaces of the heat removal device 1004. In an illustrative example, material for the encapsulant 1008 may be provided as a liquid during assembly which may be cured or hardened to adhere to the heat removal device 1004, and the insulating skirt 1005. As shown in the exploded view of FIG. 24, the encapsulant 1008 depicted removed from the assembly substantially fills the voids between the components 1001.

The assembly 1000 further includes a number of terminal pins 1010 for making electrical connections to a number of corresponding contacts (e.g., plated through holes, or surface mount pads) on the PCB 1003. In the example depicted in FIG. 24, the terminal pins 1010 are formed as through hole pins with a right angle for external connection. In various applications, the external connections may include, by way of example and not limitation, a wiring harness or PCB-mounted electrical connectors on a mother board (i.e., PCB), server PCB. In an illustrative example, one or more of the terminal pins 1010 of the assembly 1000 may be plugged into corresponding receptacles in a computer server system. Each assembly may provide, for example, power signals to operate the server.

In various embodiments, the number of modules 1002 in the assembly 1000 may be more than two, such as 3, 4, 5, 6, 7, 8, 9, or 10 or more. In some other examples, the assembly 1000 may include a single module 1002a. In an illustrative example, a portion of the terminal pins 1010 may be dedicated to receive power input signals, which may be routed by signal paths on the PCB 1003 to one or more of the modules 1002a, 1002b. Other terminal pins 1010 may be dedicated to conducting power output signals (e.g., regulated voltage, current, frequency) from the modules 1002a, 1002b to an external circuit, such as a computer server processor and/or storage system.

In some power converter assembly implementations, vertical orientation of the assembly 1000 may yield various advantages. For example, some embodiments may require a substantially reduced footprint (e.g., area) on the substrate to which it is mounted (e.g., to a printed circuit board). In some examples, thermal management may be improved, for example, by promoting convection air-flow across an enlarged vertical surface area. In some further examples, vertically-oriented embodiments may enhance thermal management, for example, by exposing an increased surface area of the assembly 1000 to heat exchange. In some examples, heat exchange associated with increased exposed surface area of vertically-oriented embodiments may be improved by, for example, passive air exchange alone or in combination with forced air flow (e.g., fans) across the sides of the assembly 1000. In some examples, heat exchangers attached in thermal communication to portions of one or more exposed surface areas of the vertically oriented embodiments may be temperature controlled. In some examples, temperature control may be achieved by active cooling alone or in combination with the use of heat removal devices. In various examples, such heat removal devices may be arranged to thermally communicate with at least a portion of the additional exposed surface areas provided in an vertically-oriented embodiment. In some examples, coolant fluid flow through a heat exchange conduit may absorb and transport heat energy away from the assembly 1000. In some examples, combinations of two or more of the above-described techniques may be implemented to manage thermal conditions in and around the power converter assembly 1000.

Although various embodiments have been described with reference to the figures, further examples are contemplated. For example, some embodiments may include multiple cavities 6 of unequal sizes and/or shapes. Some embodiments have multiple different-shape cavities that are arranged to substantially match portions of the exterior top and side surfaces of different-shape modules. In various implementations, the heat removal device may include an array of M×N cavities, where M and N may each independently be any of 1, 2, 3, 4, 5, 6, 7, 8, 9, 10, 11, 12, up to at least 20. In some implementations, the heat removal devices may incorporate a heat transfer fluid. In some embodiments, the heat transfer fluid may circulate through or around the heat removal device. In one embodiment, circulating heat transfer fluid may further circulate through a heat exchanger, which may be integrated with the heat removal device in some embodiments or separate from the heat removal device in some embodiments.

In various embodiments, the shape of an interior cavity of the heat removal device may be closely matched to the shape of the flat top and portions of the side surfaces of the module.

Various implementations may advantageously maximize performance while substantially reducing or minimizing a component count in close proximity to the point of load.

An exemplary method of manufacturing the various assemblies described above may be described with reference to the apparatus 1 of FIG. 1-8. The module 2 may be affixed to the PCB 3 (e.g., by soldering) to form a module subassembly before being installed in the heat removal device. The skirt 5 may be placed onto heat removal device and an uncured encapsulant (e.g., type SC320 encapsulant, manufactured by Dow Corning Corporation, Midland, Mich., USA) may be injected into the cavity 6 before the module subassembly (with previously attached PCB) is installed into the cavity. The encapsulant may then be allowed to cure (e.g., by application of heat or by air curing). As noted above, use of the encapsulant to fill the gap 38 may reduce the overall module thermal impedance by reducing or eliminating voids (e.g., air) in the gap. The encapsulant quantity may be controlled so that, after installation of the module subassembly, the encapsulant fills the cavity at least up to the overhang of the module without overflowing out of the cavity. The gap 38 may be controlled to be, e.g., a minimum of 0.016 inch (0.41 mm) along the perimeter sides of the module 2 and 0.020 inch (0.51 mm) between the top of the module 10 and the interior top surface 11 of the cavity 6. Alternate assembly sequences may also be employed.

In some embodiments, the skirt does not extend into the cavity beyond the terminals, which may increase the area along the perimeter surface of the module that is in efficient thermal coupling with the cavity walls. In some examples, the skirt may also serve to provide minimum spacing between the module perimeter walls and the cavity walls to ensure adequate penetration of the encapsulant and sufficient bonding strength.

In some examples, the skirt 5 may extend far enough into the cavity of some embodiments to provide electrical insulation between the module terminals and the cavity walls along substantially the entire length of the terminals.

In some embodiments, a controlled quantity of encapsulant is provided in the cavity. Controlled encapsulant quantities may advantageously provide sufficient volume to cover a predetermined minimum amount of the module and cavity surfaces. Further, controlled encapsulant quantities may further help to avoid an excess which would spill out of the cavity during assembly.

In the example shown in FIGS. 11 and 12, the electronic power conversion module 2 may include a first power converter, the electronic power conversion module 102 may include a second power converter, and the electronic power conversion modules 2 and 102 may be connected in cascade with an output of the electronic power conversion module 2 connected to an input of the electronic power conversion module 102.

In some examples, the skirt 5 (also referred to as a bezel) in FIGS. 1-8 may have an internal flange adapted to extend into and proximate the side walls of the cavity 6, an internal shoulder adapted to rest against the heat removal device 4 at places along a perimeter of the cavity 6, an outer flange adapted to surround at least a portion of a perimeter edge of the PCB 3, and an outer shoulder adapted to rest against a surface of the PCB 3.

In some examples, the skirt 105 (also referred to as a bezel) in FIGS. 11-18 may have a first internal flange adapted to extend into and proximate the side walls of the cavity 6, a first internal shoulder adapted to rest against a first portion of the heat removal device 104 associated with the module 2 at places along a perimeter of the cavity 6, a second internal flange adapted to extend into and proximate the side walls of the cavity 106, a second internal shoulder adapted to rest against a second portion of the heat removal device 104 associated with the module 102 at places along a perimeter of the cavity 106, an outer flange adapted to surround at least a portion of a perimeter edge of an external PCB 103, and an outer shoulder adapted to rest against a surface of the external PCB 103.

In some examples, the thermally conductive substance used to fill the gap between the interior surface of the cavity 6 and the exterior surface of the module 2 provides a minimum level of adhesion between the interior surface of the cavity 6 and the exterior surface of the module 2, providing mechanical integrity of the power converter 1.

A number of embodiments have been described. Nevertheless, it will be understood that various modifications may be made. For example, advantageous results may be achieved if the steps of the disclosed techniques were performed in a modified sequence, if components in the disclosed systems were combined in a different manner, or if the described components were replaced or supplemented by other components. The functions and processes (including algorithms) may be performed in hardware, software, or a combination thereof. The disclosed systems or certain sub-components may be integrated, in whole or in part, on a single integrated circuit (IC), or implemented using discrete components and one or more ICs. Accordingly, other embodiments are within the scope of the following claims.

What is claimed is:

1. An apparatus comprising:
   (a) a first encapsulated electronic module configured as a self-contained assembly and having
      a first generally box-like exterior shape including a generally flat top surface and a perimeter surface comprising side surfaces adjoining the top surface, each side surface having a length along a perimeter of the exterior shape and a height normal (generally perpendicular) to a plane parallel to the top surface;
      electronic circuitry within the first exterior shape, the electronic circuitry including a plurality of heat dissipating devices;
      a heat conducting structure internal to the first module adapted to conduct heat from the heat dissipating devices to a selected area of the perimeter surface; and
      a plurality of module terminals for making electrical connections to the electronic circuitry of the first module;
   (b) a heat removal device comprising a first cavity having an interior surface, the interior surface having
      an upper surface adapted to match a portion of the top surface;
      side walls adapted to match a portion of the perimeter surface, the matched portion of the perimeter surface comprising at least fifty percent (50%) of the selected area of the perimeter surface; and
      wherein the interior surface is adapted to receive at least fifty percent (50%) of the first exterior shape,
      wherein the matched portion of the perimeter surface is at least thirty three percent (33%) of the matched portion of the top surface by area; and
   (c) a thermally conductive substance in the first cavity adapted to thermally couple the upper surface and side walls of the first cavity to the matched portions of the top and perimeter surfaces of the first module.

2. The apparatus of claim 1, wherein the heat conducting structure comprises a multilayer substrate having at least 4 metallization layers each at least 2.2 mils thick and at least 3 insulation layers.

3. The apparatus of claim 2, wherein the multilayer substrate comprises an internal printed circuit board ("PCB") having a plurality of conductive traces adapted to connect to the heat dissipating devices and to respective ones of the plurality of module terminals, the plurality of conductive traces being formed in a plurality of the metallization layers.

4. The apparatus of claim 3, wherein the internal PCB comprises at least 6 conductive layers.

5. The apparatus of claim 3, wherein the internal PCB further comprises at least 14 conductive layers.

6. The apparatus of claim 3, wherein the plurality of module terminals are arranged along a bottom surface of the first module.

7. The apparatus of claim 3, wherein the plurality of module terminals are arranged along one or more overhang surfaces generally parallel to the top surface and adjacent to the perimeter surface of the first module.

8. The apparatus of claim 3, further comprising an external PCB external to the first module, the external PCB comprising conductive traces having a module contact region for connecting to respective ones of said module terminals and a system contact region for connecting to respective ones of a plurality of system terminals, the system terminals providing for electrical connection between the first module and circuitry external to the apparatus.

9. The apparatus of claim 8, wherein the external PCB lies adjacent to a bottom surface of the first module.

10. The apparatus of claim 9, wherein the bottom surface of the first module is generally rectangular and the external PCB lies adjacent and generally parallel to the bottom surface of the first module.

11. The apparatus of claim 1, wherein the interior surface of the first cavity is adapted to receive substantially all of the top surface.

12. The apparatus of claim 1, wherein the interior surface of the first cavity is adapted to receive substantially all of the perimeter surface.

13. The apparatus of claim 1, wherein the heat removal device further comprises a second cavity, and further comprising:
   a second encapsulated electronic module configured as a self-contained assembly and having
      a second generally box-like exterior shape including a generally flat top surface and a perimeter surface comprising side surfaces adjoining the top surface, each side surface having a length along a perimeter of the exterior shape and a height normal (generally perpendicular) to a plane parallel to the flat top surface;
      electronic circuitry within the second exterior shape, the electronic circuitry including a plurality of heat dissipating devices;
      a heat conducting structure internal to the second module adapted to conduct heat from the heat dissipating devices to a selected area of the perimeter surface of the second module; and
      a plurality of module terminals for making electrical connections to the electronic circuitry of the second module,
   wherein the second cavity comprises an interior surface adapted to receive at least fifty percent of the second exterior shape, the interior surface of the second cavity having:
      an upper surface adapted to match a portion of the top surface of the second exterior shape; and
      side walls adapted to match a portion of the perimeter surface of the second exterior shape, the matched portion of the perimeter surface of the second module comprising at least fifty percent (50%) of the selected area of the perimeter surface of the second module,
      wherein the matched portion of the perimeter surface of the second module is at least thirty three percent (33%) of the matched portion of the top surface of the second module by area; and
   further comprising a thermally conductive substance in the second cavity adapted to thermally couple the upper surface and side walls of the second cavity to the matched portions of the top and perimeter surfaces of the second module; and
   an external printed circuit board ("PCB") external to the first and second modules, the external PCB comprising conductive traces having first and second module contact regions for connecting to respective ones of said plurality of module terminals of the first and second modules and a system contact region for connecting to respective ones of a plurality of system terminals, the system terminals providing for electrical connection between the first and second modules and circuitry external to the apparatus.

14. The apparatus of claim 13, wherein, for each of the first and second modules, the matched portion of the perimeter surface of the respective module is at least fifty percent (50%) of the matched portion of the top surface of the respective module by area.

15. The apparatus of claim 13, wherein, for each of the first and second modules, the matched portion of the perimeter surface of the respective module comprises at least fifty percent (50%) of the entire perimeter surface of the respective module by area.

16. The apparatus of claim 13, wherein the plurality of module terminals are arranged along a bottom surface of the first and second modules.

17. The apparatus of claim 13, wherein the plurality of module terminals of the first and second modules are arranged along a respective one or more overhang surfaces generally parallel to the top surface and adjacent to the perimeter surface of the respective module.

18. The apparatus of claim 13, wherein the first module comprises a first power converter and the second module comprises a second power converter and wherein the first and second modules are connected together to form a power sharing array.

19. The apparatus of claim 13, wherein the first module comprises a first power converter, the second module comprises a second power converter, and the first and second modules are connected in cascade with an output of the first power converter connected to an input of the second power converter.

20. The apparatus of claim 1, wherein the first module comprises an encapsulating material forming at least some of the top and perimeter surfaces of the exterior shape of the first module.

21. The apparatus of claim 13, wherein the first and second modules comprise an encapsulating material forming at least some of their respective top and perimeter surfaces of their respective exterior shapes.

22. The apparatus of claim 1, further comprising a bezel having an internal flange adapted to extend into and proximate the side walls of the first cavity;
an internal shoulder adapted to rest against the heat removal device at places along a perimeter of the first cavity;
an outer flange adapted to surround at least a portion of a perimeter edge of an external PCB; and
an outer shoulder adapted to rest against a surface of the external PCB.

23. The apparatus of claim 22, wherein the bezel is adapted to
provide electrical insulation between the terminals and the side walls of the first cavity; and
provide a controlled minimum space between the perimeter surface of the first module and the side walls of the first cavity.

24. The apparatus of claim 22, wherein:
the thermally conductive substance comprises a controlled volume of encapsulating material, the controlled volume being set to ensure filling of the first cavity to a predetermined minimum level with the first module assembled in the first cavity;
the thermally conductive substance is cured to a solid state, and
the thermally conductive substance comprises a minimum level of adhesion between the interior surface of the first cavity and the exterior surface of the first module providing mechanical integrity of the apparatus.

25. The apparatus of claim 13, further comprising a bezel having
a first internal flange adapted to extend into and proximate the side walls of the first cavity;
a first internal shoulder adapted to rest against a first portion of the heat removal device associated with the first module at places along a perimeter of the first cavity;
a second internal flange adapted to extend into and proximate the side walls of the second cavity;
a second internal shoulder adapted to rest against a second portion of the heat removal device associated with the second module at places along a perimeter of the second cavity;
an outer flange adapted to surround at least a portion of a perimeter edge of the external PCB; and
an outer shoulder adapted to rest against a surface of the external PCB.

26. The apparatus of claim 25, wherein the bezel is adapted to
provide electrical insulation between the terminals of the first and second modules and the side walls of the first and second cavities;
provide a controlled minimum space between the perimeter surfaces of the first and second modules and the side walls of the first and second cavities, respectively.

27. The apparatus of claim 25, wherein:
the thermally conductive substance comprises a respective controlled volume of encapsulating material in each of the first and second cavities, the respective controlled volume being set to ensure filling of the first and second cavities to a respective predetermined minimum level with the respective modules assembled in the respective cavities;
the thermally conductive substance is cured to a solid state, and
the thermally conductive substance comprises a minimum level of adhesion between the interior surfaces of the respective cavities and the respective exterior surfaces of the respective modules providing mechanical integrity to the apparatus.

28. A method of making an electronic power component comprising:
providing heat dissipating electronic circuitry in a first module configured as a stand alone assembly and having module terminals for making electrical connections to the electronic circuitry;
providing the first module with a generally box-like exterior shape including a generally flat top surface and a perimeter surface comprising side surfaces adjoining the top surface;
providing a heat conducting structure internal to the first module adapted to conduct heat from the heat dissipating devices to a selected area of the perimeter surface;
providing a heat removal device for the first module;
providing a first cavity in the heat removal device, the first cavity including an interior surface having an upper surface and side walls;
adapting the upper surface to match a portion of the top surface of the module;
adapting the side walls to match a portion of the perimeter surface comprising at least fifty percent (50%) of the selected area;
adapting the interior surface to receive at least fifty percent (50%) of the exterior shape of the first module;

configuring the interior surface such that the matched portion of the perimeter surface is at least thirty three percent (33%) of the matched portion of the top surface by area; and providing a thermally conductive substance in the first cavity adapted to thermally couple the upper surface and side walls of the first cavity to the matched portions of the top and perimeter surfaces of the first module.

29. The method of claim 28, further comprising:
providing an external printed circuit board ("PCB") external to the first module;
connecting contact regions on the external PCB to respective module terminals of the first module; and
providing system terminals for establishing electrical connection between the first module and circuitry external to the apparatus.

30. The method of claim 28, further comprising:
providing additional heat dissipating electronic circuitry in a second module configured as a stand alone assembly, the second module having a generally box-like exterior shape including a generally flat top surface and a perimeter surface comprising side surfaces adjoining the top surface;
providing a second cavity in the heat removal device including an interior surface adapted to receive at least a portion of the second exterior shape including at least a portion of the top surface, said portion comprising a second top surface area, and at least a portion of the perimeter surface, said portion comprising a second perimeter surface area;
providing a thermally conductive substance between said portions of the second top and first perimeter surface areas of the second module and the interior surface of the second cavity; and
configuring said second perimeter surface area to be at least 33% of the second top surface area.

31. The method of claim 30, further comprising providing an external printed circuit board ("PCB") external to the first and second modules, the external PCB comprising conductive traces having first and second module contact regions for connecting to respective first and second module terminals and a system contact region for connecting to respective system terminals, the system terminals providing for electrical connection between the first and second modules and circuitry external to the apparatus.

32. The method of claim 31, further comprising forming a power converter wherein the first module comprises a first power converter and the second module comprises a second power converter and further comprising connecting the modules together to form a power sharing array.

33. The method of claim 31, further comprising forming a power converter wherein the first module comprises a first power converter, the second module comprises a second power converter, and further comprising connecting an output of the first power converter to an input of the second power converter.

* * * * *